(12) United States Patent
Urano

(10) Patent No.: US 8,729,735 B2
(45) Date of Patent: May 20, 2014

(54) WIRELESS POWER FEEDER, WIRELESS POWER RECEIVER, AND WIRELESS POWER TRANSMISSION SYSTEM

(75) Inventor: Takashi Urano, Tokyo (JP)

(73) Assignee: TDK Corporation, Tokyo (JP)

( * ) Notice: Subject to any disclaimer, the term of this patent is extended or adjusted under 35 U.S.C. 154(b) by 781 days.

(21) Appl. No.: 12/944,566

(22) Filed: Nov. 11, 2010

(65) Prior Publication Data

US 2011/0127846 A1   Jun. 2, 2011

(30) Foreign Application Priority Data

| Nov. 30, 2009 | (JP) | ................................. 2009-271356 |
| Dec. 2, 2009 | (JP) | ................................. 2009-274444 |
| Aug. 18, 2010 | (JP) | ................................. 2010-182830 |
| Aug. 18, 2010 | (JP) | ................................. 2010-182831 |

(51) Int. Cl.
*H01F 37/00* (2006.01)
*H02J 17/00* (2006.01)

(52) U.S. Cl.
CPC ..................................... *H02J 17/00* (2013.01)
USPC ......................................................... 307/104

(58) Field of Classification Search
USPC ......................................................... 307/104
See application file for complete search history.

(56) References Cited

U.S. PATENT DOCUMENTS

| 5,095,224 A * | 3/1992 | Renger .......................... 327/110 |
| 8,531,059 B2 * | 9/2013 | Ichikawa et al. ............... 307/104 |

| 2003/0057873 A1 | 3/2003 | Suzuki et al. |
| 2006/0050820 A1 | 3/2006 | Kawada et al. |
| 2007/0222542 A1 | 9/2007 | Joannopoulos et al. |
| 2008/0278264 A1 | 11/2008 | Karalis et al. |
| 2009/0015075 A1 | 1/2009 | Cook et al. |
| 2009/0051298 A1 | 2/2009 | Shinmen et al. |
| 2009/0072629 A1 | 3/2009 | Cook et al. |
| 2010/0225271 A1 | 9/2010 | Oyobe et al. |
| 2011/0121778 A1 | 5/2011 | Oyobe et al. |
| 2012/0032525 A1 | 2/2012 | Oyobe et al. |

FOREIGN PATENT DOCUMENTS

| CN | 1739271 A | 2/2006 |
| JP | 03-284135 A | 12/1991 |
| JP | 10-108391 A | 4/1998 |
| JP | 10-225129 A | 8/1998 |
| JP | 2003-033011 | 1/2003 |
| JP | 2003168585 A | 6/2003 |
| JP | 2004-080844 A | 3/2004 |
| JP | 2006-074848 | 3/2006 |
| JP | 2006-208790 A | 8/2006 |
| JP | 2006-230032 | 8/2006 |
| JP | 2007-336717 A | 12/2007 |
| JP | 2008-172872 | 7/2008 |

(Continued)

*Primary Examiner* — Hal Kaplan
(74) *Attorney, Agent, or Firm* — McDermott Will & Emery LLP

(57) ABSTRACT

Power is fed from a feeding coil L2 to a receiving coil L3 by magnetic resonance. A VCO 202 alternately turns ON/OFF switching transistors Q1 and Q2 at a drive frequency fo, whereby AC power is fed to the feeding coil L2, and then the AC power is fed from the feeding coil L2 to the receiving coil L3. A phase detection circuit 114 detects a phase difference between the current phase and voltage phase, and the VCO 202 adjusts the drive frequency fo such that the phase difference becomes zero. When load voltage is changed, the detected current phase value is adjusted with the result that the drive frequency fo is adjusted.

13 Claims, 27 Drawing Sheets

(56) References Cited

FOREIGN PATENT DOCUMENTS

| JP | 2009-106136 A | 5/2009 |
|----|---------------|--------|
| WO | WO 2006/022365 A1 | 3/2006 |
| WO | 2007091403 A1 | 8/2007 |
| WO | WO-2009/054221 A1 | 4/2009 |

* cited by examiner

WIRELESS POWER FEEDER, WIRELESS POWER RECEIVER, AND WIRELESS POWER TRANSMISSION SYSTEM

BACKGROUND OF THE INVENTION

1. Field of the Invention

The present invention relates to a wireless AC power feeding and, more particularly, to power control thereof.

2. Description of Related Art

A wireless power feeding technique of feeding power without a power cord is now attracting attention. The current wireless power feeding technique is roughly divided into three: (A) type utilizing electromagnetic induction (for short range); (B) type utilizing radio wave (for long range); and (C) type utilizing resonance phenomenon of magnetic field (for intermediate range).

The type (A) utilizing electromagnetic induction has generally been employed in familiar home appliances such as an electric shaver; however, it can be effective only in a short range of several centimeters. The type (B) utilizing radio wave is available in a long range; however, it cannot feed big electric power. The type (C) utilizing resonance phenomenon is a comparatively new technique and is of particular interest because of its high power transmission efficiency even in an intermediate range of about several meters. For example, a plan is being studied in which a receiving coil is buried in a lower portion of an EV (Electric Vehicle) so as to feed power from a feeding coil in the ground in a non-contact manner. The wireless configuration allows a completely insulated system to be achieved, which is especially effective for power feeding in the rain.

Hereinafter, the type (C) is referred to as "magnetic field resonance type".

The magnetic field resonance type is based on a theory published by Massachusetts Institute of Technology in 2006 (refer to Patent Document 1). In Patent Document 1, four coils are prepared. The four coils are referred to as "exciting coil", "feeding coil", "receiving coil", and "loading coil" in the order starting from the feeding side. The exciting coil and feeding coil closely face each other for electromagnetic coupling. Similarly, the receiving coil and loading coil closely face each other for electromagnetic coupling. The distance (intermediate distance) between the feeding coil and receiving coil is larger than the distance between the exciting coil and feeding coil and distance between the receiving coil and loading coil. This system aims to feed power from the feeding coil to receiving coil.

When AC power is fed to the exciting coil, current also flows in the feeding coil according to the principle of electromagnetic induction. When the feeding coil generates a magnetic field to cause the feeding coil and receiving coil to magnetically resonate, large current flows in the receiving coil. At this time, current also flows in the loading coil according to the principle of electromagnetic induction, and power is taken out from a load connected in series to the loading coil. By utilizing the magnetic field resonance phenomenon, high power transmission efficiency can be achieved even if the feeding coil and receiving coil are largely spaced from each other.

CITATION LIST

Patent Document

[Patent Document 1] U.S. Pat. Appln. Publication No. 2008/0278264

[Patent Document 2] Jpn. Pat. Appln. Laid-Open Publication No. 2006-230032

[Patent Document 3] International Publication Pamphlet No. WO2006/022365

[Patent Document 4] U.S. Pat. Appln. Publication No. 2009/0072629

[Patent Document 5] U.S. Pat. Appln. Publication No. 2009/0015075

[Patent Document 6] Jpn. Pat. Appln. Laid-Open Publication No. 2008-172872

[Patent Document 7] Jpn. Pat. Appln. Laid-Open Publication No. 2006-74848

[Patent Document 8] Jpn. Pat. Appln. Laid-Open Publication No. 2003-33011

The present inventor considers that a mechanism for automatically controlling feeding power so as to make output power stable is required in order to extend the applicability of wireless power feeding. In a non-contact type power feeder disclosed in Patent Document 7, which is of the type (A), a secondary side unit on the receiving side notifies a primary side unit on the transmission side of the magnitude of output voltage, and the primary side unit controls feeding power in accordance with the output voltage. More specifically, a signal indicating the magnitude of the output voltage is transmitted from a coil L4 (secondary side unit) to a coil L3 (primary side unit).

In the non-contact type power feeder of Patent Document 7, it is silently assumed that the resonance frequency of a primary side series resonance circuit or a secondary side series resonance circuit is set to a fixed value. However, in the case of power feeding of a magnetic field resonance type, the resonance frequency is liable to change depending on the positional relationship between feeding and receiving coils and, therefore, the mechanism of Patent Document 7 cannot practically be applied to the magnetic field resonance type. Further, it is considered that, in the case of the magnetic field resonance type, a magnetic field generated by feeding or receiving coil greatly affects on signal transmission from the coil L4 to coil L3 made by using electromagnetic wave.

SUMMARY

A main object of the present invention is to effectively control feeding power in wireless power feeding of a magnetic field resonance type.

A wireless power feeder according to a first aspect of the present invention is a device for feeding power by wireless from a feeding coil to a receiving coil. The wireless power feeder includes: a power transmission control circuit that feeds AC power to the feeding coil at a drive frequency; a feeding coil circuit that includes the feeding coil and a capacitor and resonates at a resonance frequency of the receiving coil; a phase detection circuit that detects a phase difference between the voltage phase and current phase of the AC power; and a signal receiving circuit that receives an output signal indicating the magnitude of an output from the power receiving side. The power transmission control circuit adjusts the drive frequency so as to reduce the phase difference to make the drive frequency track the resonance frequency. The phase detection circuit performs ex-post adjustment of the detected value of both or one of the voltage and current phases according to the output signal.

The current phase and voltage phase of the AC power are compared to detect the phase difference between the current and voltage phases. Adjusting the drive frequency so as to reduce the detected phase difference allows the drive frequency to track the resonance frequency. As a result, even if the resonance frequency is changed, the power transmission efficiency is easily kept constant. Further, ex-post adjustment of the voltage phase or current phase in accordance with a variation of the output voltage, even if it occurs, causes the drive frequency to be changed in accordance with the adjusted phase difference. Thus, the feeding power can be feedback-controlled using the drive frequency as a parameter, making it easy to stabilize the output voltage.

The phase detection circuit may convert both or one of voltage and current components of the AC power into a signal having a saw-tooth waveform for detection of the phase difference. The signal receiving circuit may receive the output signal as a light signal such as an infrared ray. The output signal may be an AC signal indicating the magnitude of the output by the magnitude of signal frequency. The phase detection circuit may compare a first phase value indicating a timing at which the voltage level of the AC power becomes a first reference value and a second phase value indicating a timing at which the current level of the AC power becomes a second reference value to detect the phase difference and change both or one of the first and second reference values based on the output signal to perform ex-post adjustment of both or one of the first and second phase values.

The wireless power feeder may further include an exciting coil that is magnetically coupled to the feeding coil and feeds AC power fed from the power transmission control circuit to the feeding coil. The power transmission control circuit may include first and second current paths and make first and second switches connected in series respectively to the first and second current paths alternately conductive at the drive frequency to feed the AC power to the exciting coil.

The wireless power feeder may further include a detection coil that generates inductive current using a magnetic field generated by the AC power. The phase detection circuit may measure the phase of the inductive current flowing in the detection coil to achieve measurement of the current phase of the AC power. Since the current phase is measured from the inductive current flowing in the detection coil, a measurement load is difficult to be directly applied to the feeding coil. The detection coil may generate the inductive current using a magnetic field generated by the AC power flowing in the feeding coil.

A wireless power receiver according to a second aspect of the present invention is a device that receives AC power fed from the wireless power feeder as described above by wireless at a receiving coil. The wireless power receiver includes: a receiving coil circuit that includes the receiving coil and a capacitor and resonates at the resonance frequency of the feeding coil; a loading circuit that includes a loading coil that is magnetically coupled to the receiving coil to receive the AC power from the receiving coil and a load that receives power from the loading coil; and a signal transmission circuit that transmits, to the wireless power feeder, an output signal indicating the magnitude of output voltage to be applied to a part of the loading circuit.

The signal transmission circuit may transmit the output signal as a signal indicating a difference value between the output voltage and a reference voltage. The value of the reference voltage may manually be adjustable. The output signal may be an AC signal indicating the magnitude of the output voltage by the magnitude of signal frequency. The output voltage may be generated as a DC current by the rectification circuit provided in the loading circuit.

A wireless power transmission system according to a third aspect of the present invention is a system for feeding power by wireless from a feeding coil to a receiving coil. The system includes: a power transmission control circuit that feeds AC power to the feeding coil at a drive frequency; a feeding coil circuit that includes the feeding coil and a first capacitor; a receiving coil circuit that includes the receiving coil and a second capacitor; a loading circuit that includes a loading coil that is magnetically coupled to the receiving coil to receive the AC power from the receiving coil and a load that receives power from the loading coil; and a phase detection circuit that detects a phase difference between the voltage phase and current phase of the AC power. The power transmission control circuit adjusts the drive frequency so as to reduce the phase difference. The phase detection circuit performs ex-post adjustment of the detected value of both or one of the voltage and current phases according to the magnitude of an output voltage to be applied to a part of the loading circuit.

A wireless power feeder according to a fourth aspect of the present invention is a device for feeding power by wireless from a feeding coil to a receiving coil. The wireless power feeder includes: a power transmission control circuit that feeds AC power to the feeding coil at a drive frequency; a feeding coil circuit that includes the feeding coil and a capacitor and resonates at a resonance frequency of the receiving coil; a phase detection circuit that detects a phase difference between the voltage phase and current phase of the AC power; and a signal receiving circuit that receives an output signal indicating an output by a duty ratio from the power receiving side of the AC power and DC-converts the output signal in accordance with the duty ratio. The power transmission control circuit adjusts the drive frequency so as to reduce the phase difference to make the drive frequency track the resonance frequency. The phase detection circuit performs ex-post adjustment of the detected value of both or one of the voltage and current phases in accordance with the signal level of the DC-converted output signal.

The current phase and voltage phase of the AC power are compared to detect the phase difference between the current and voltage phases. Adjusting the drive frequency so as to reduce the detected phase difference allows the drive frequency to track the resonance frequency. As a result, even if the resonance frequency is changed, the power transmission efficiency is easily kept constant. Further, ex-post adjustment of the voltage phase or current phase in accordance with a variation of the output voltage, even if it occurs, causes the drive frequency to be changed in accordance with the adjusted phase difference. Thus, the feeding power can be feedback-controlled using the drive frequency as a parameter, making it easy to stabilize the output voltage.

The phase detection circuit may compare a first phase value indicating a timing at which the voltage level of the AC power becomes a first reference value and a second phase value indicating a timing at which the current level of the AC power becomes a second reference value to detect the phase difference and change both or one of the first and second reference values in accordance with the signal level to perform ex-post adjustment of both or one of the first and second phase values. The signal receiving circuit may receive the output signal as a light signal such as an infrared ray.

The wireless power feeder may further include an exciting coil that is magnetically coupled to the feeding coil and feeds AC power fed from the power transmission control circuit to the feeding coil. The power transmission control circuit may include first and second current paths and make first and second switches connected in series respectively to the first and second current paths alternately conductive at the drive frequency to feed the AC power to the exciting coil.

The wireless power feeder may further include a detection coil that generates inductive current using a magnetic field generated by the AC power. The phase detection circuit may measure the phase of the inductive current flowing in the detection coil to achieve measurement of the current phase of the AC power. Since the current phase is measured from the inductive current flowing in the detection coil, a measurement load is difficult to be directly applied to the feeding coil. The detection coil may generate the inductive current using a magnetic field generated by the AC power flowing in the feeding coil.

A wireless power receiver according to a fifth aspect of the present invention is a device that receives AC power fed from the wireless power feeder as described above by wireless at a receiving coil. The wireless power receiver includes: a receiving coil circuit that includes the receiving coil and a capacitor and resonates at the resonance frequency of the feeding coil; a loading circuit that includes a loading coil that is magnetically coupled to the receiving coil to receive the AC power from the receiving coil and a load that receives power from the loading coil; and a signal transmission circuit that transmits, to the wireless power feeder, an output signal indicating output voltage to be applied to a part of the loading circuit by a duty ratio.

The signal transmission circuit may transmit the output signal as a signal indicating a difference value between the output voltage and a reference voltage by the duty ratio. The value of the reference voltage may manually be adjustable.

The wireless power receiver may further include: a control signal generation circuit that generates a control signal at a predetermined control frequency; and a comparison circuit that generates an enable signal when a predetermined magnitude relationship is established between the signal level of the control signal and the output voltage. The signal transmission circuit may determine the duty ratio of the output signal based on the duty ratio of the enable signal. The "predetermined magnitude relationship" may be that the level of the control signal is higher than a predetermined level representing a variation of the output voltage, or vice versa.

The wireless power receiver may further include a reference signal generation circuit that generates a reference signal having a reference frequency higher than the control frequency. The signal transmission circuit may transmit the reference signal as the output signal only while the enable signal is being generated.

A wireless power transmission system according to a sixth aspect of the present invention is a system for feeding power by wireless from a feeding coil to a receiving coil. The system includes: a power transmission control circuit that feeds AC power to the feeding coil at a drive frequency; a feeding coil circuit that includes the feeding coil and a first capacitor; a receiving coil circuit that includes the feeding coil and a second capacitor; a loading circuit that includes a loading coil that is magnetically coupled to the receiving coil to receive the AC power from the receiving coil and a load that receives power from the loading coil; a phase detection circuit that detects a phase difference between the voltage phase and current phase of the AC power; a signal transmission circuit that transmits, to the power feeder side, an output signal indicating output voltage to be applied to a part of the loading circuit by a duty ratio; and a signal receiving circuit that receives the output signal at the power feeder side and DC-converts the output signal in accordance with the duty ratio. The power transmission control circuit adjusts the drive frequency so as to reduce the phase difference. The phase detection circuit performs ex-post adjustment of the detected value of both or one of the voltage and current phases in accordance with the signal level of the DC-converted output signal.

It is to be noted that any arbitrary combination of the above-described structural components and expressions changed between a method, an apparatus, a system, etc. are all effective as and encompassed by the present embodiments.

According to the present invention, it is possible to effectively control transmission power in wireless power feeding of a magnetic field resonance type.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A preferred embodiment of the present invention will be described below with reference to the accompanying drawings.

[First Embodiment]

Figure 1:
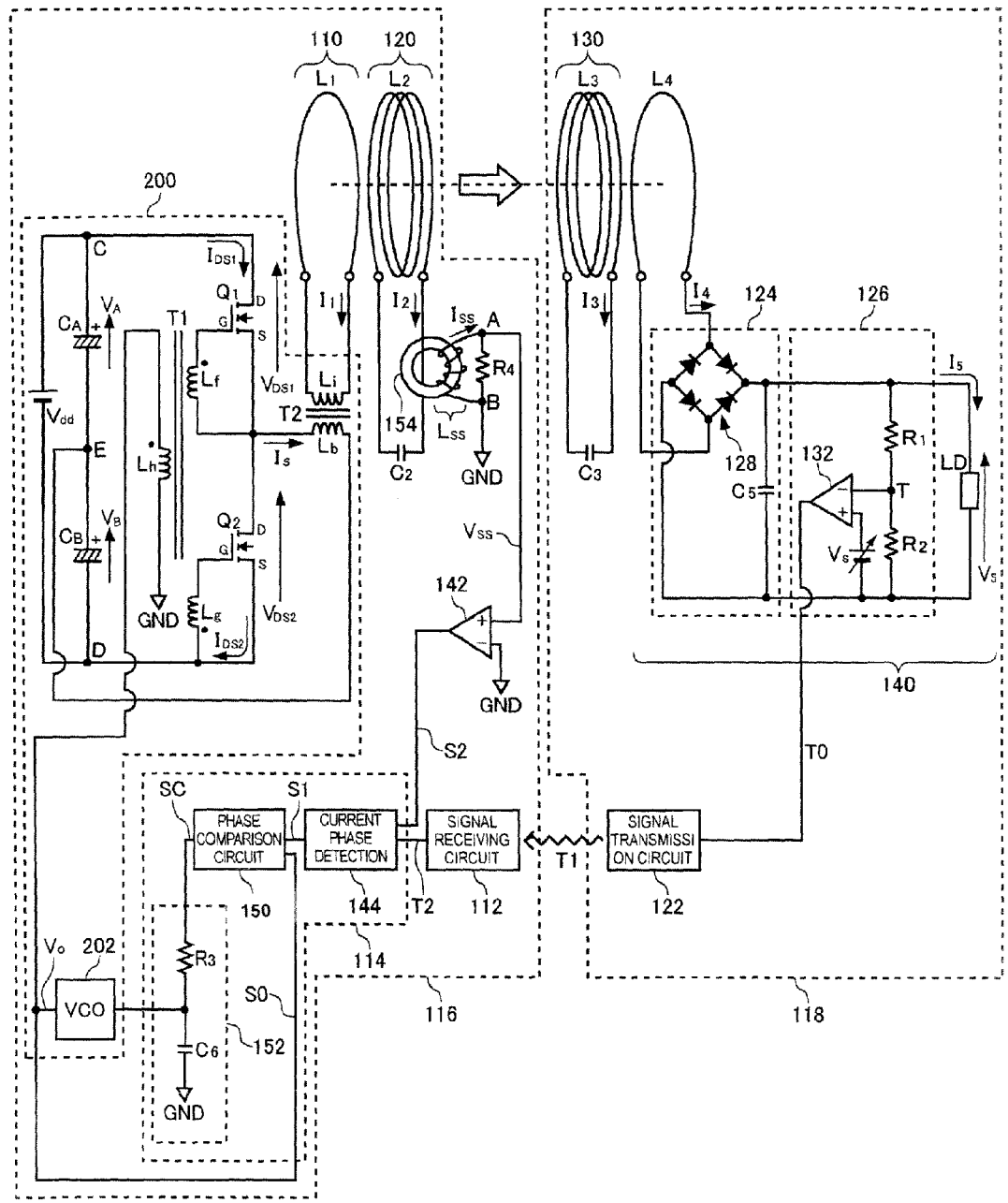
FIG. 1 is a system configuration view of a wireless power transmission system in a first embodiment.

FIG. 1 is a system configuration view of a wireless power transmission system 100 according to the first embodiment. The wireless power transmission system 100 includes a wireless power feeder 116 and a wireless power receiver 118. The wireless power feeder 116 includes, as basic components, a power transmission control circuit 200, an exciting circuit 110, a feeding coil circuit 120, a phase detection circuit 114, and a signal receiving circuit 112. The wireless power receiver 118 includes a receiving coil circuit 130, a loading circuit 140, and a signal transmission circuit 122.

A distance (hereinafter, referred to as "inter-coil distance") of about 0.2 m to 1.0 m is provided between a feeding coil L2 of the feeding coil circuit 120 and a receiving coil L3 of the receiving coil circuit 130. The wireless power transmission system 100 mainly aims to feed power from the feeding coil L2 to receiving coil L3 by wireless. In the first embodiment, a description will be made assuming that resonance frequency fr is 100 kHz. The wireless power transmission system of the first embodiment may be made to operate in a high-frequency band like ISM (Industry-Science-Medical) frequency band. A low frequency band is advantageous over a high frequency band in reduction of cost of a switching transistor (to be described later) and reduction of switching loss. In addition, the low frequency band is less constrained by Radio Act.

The exciting circuit 110 is a circuit in which an exciting coil L1 and a transformer T2 secondary coil Li are connected in series. The transformer T2 secondary coil Li constitutes a coupling transformer T2 together with a transformer T2 primary coil Lb and receives AC power from the power transmission control circuit 200 by electromagnetic induction. The number of windings of the exciting coil L1 is 1, diameter of a conductive wire is 5 mm, and shape of the exciting coil L1 itself is a square of 210 mm×210 mm. In FIG. 1, the exciting coil L1 is represented by a circle for clarification. Other coils are also represented by circles for the same reason. All the coils illustrated in FIG. 1 are made of copper. Current I1 flowing in the exciting circuit 110 is AC.

The feeding coil circuit 120 is a circuit in which a feeding coil L2 and a capacitor C2 are connected in series. The exciting coil L1 and feeding coil L2 face each other. The distance between the exciting coil L1 and feeding coil L2 is as comparatively small as 10 mm or less. Thus, the exciting coil L1 and feeding coil L2 are electromagnetically strongly coupled to each other. The number of windings of the feeding coil L2 is 7, diameter of a conductive wire is 5 mm, and shape of the feeding coil L2 itself is a square of 280 mm×280 mm. When the AC current I1 is made to flow in the exciting coil L1, an electromotive force occurs in the feeding coil L2 according to the principle of electromagnetic induction to cause AC current I2 to flow in the feeding coil circuit 120. The AC current I2 is considerably larger than the AC current I1. The values of the feeding coil L2 and capacitor C2 are set such that the resonance frequency fr of the feeding coil circuit 120 is 100 kHz.

The receiving coil circuit 130 is a circuit in which a receiving coil L3 and a capacitor C3 are connected in series. The feeding coil L2 and receiving coil L3 face each other. The number of windings of the receiving coil L3 is 7, diameter of a conductive wire is 5 mm, and shape of the receiving coil L3 itself is a square of 280 mm×280 mm. The values of the receiving coil L3 and capacitor C3 are set such that the resonance frequency fr of the receiving coil circuit 130 is also 100 kHz. Thus, the feeding coil L2 and receiving coil L3 need not have the same shape. When the feeding coil L2 generates a magnetic field at the resonance frequency fr=100 kHz, the feeding coil L2 and receiving coil L3 magnetically resonate, causing large current I3 to flow in the receiving coil circuit 130.

The loading circuit 140 is a circuit in which a loading coil L4 is connected to a load LD through a rectification circuit 124 and a measurement circuit 126. The receiving coil L3 and loading coil L4 face each other. The distance between the receiving coil L3 and loading coil L4 is as comparatively small as about 10 mm or less. Thus, the receiving coil L3 and loading coil L4 are electromagnetically strongly coupled to each other. The number of windings of the loading coil L4 is 1, diameter of the wire of the loading coil L4 is 5 mm, and shape of the loading coil L4 itself is a square of 300 mm×300 mm. When the current I3 is made to flow in the receiving coil L3, an electromotive force occurs in the loading circuit 140 to cause AC current I4 to flow in the loading circuit 140. The AC current I4 is rectified into DC current by the rectification circuit 124. Although part of the DC current flows in the measurement circuit 126, most of the DC current flows in the load LD as DC current I5. The rectification circuit 124 is a general circuit constituted by a bridge circuit 128 and a capacitor C5. The details of the measurement circuit 126 will be described later.

The AC power fed from the feeding coil L2 of the wireless power feeder 116 is received by the receiving coil L3 of the wireless power receiver 118 and then extracted from the load LD as DC power. Voltage applied to the load LD is referred to as "load voltage V5".

If the load LD is connected in series to the receiving coil circuit 130, the Q-value of the receiving coil circuit 130 is degraded. Therefore, the receiving coil circuit 130 for power reception and loading circuit 140 for power extraction are separated from each other. In order to enhance the power transmission efficiency, the center lines of the feeding coil L2, receiving coil L3, and loading coil L4 are preferably made to coincide with one another.

The measurement circuit 126 includes resistors R1 and R2, a control power supply Vs, and a comparator 132. The load voltage V5 is divided by the resistors R1 and R2. Voltage applied to both ends of the resistors R2 is referred to as "output voltage". The potential at a connecting point T between the resistors R1 and R2 is input to the negative terminal of the comparator 132 as "measurement potential". A control power supply Vs is connected to the positive terminal of the comparator 132. Input voltage at the positive terminal of the comparator 132 generated by the control power supply Vs is referred to as "reference potential". The control power supply Vs is a variable DC voltage supply, and the voltage thereof can arbitrarily be adjusted. The comparator 132 amplifies a difference (hereinafter, referred to as "correction voltage") between the measurement potential and reference potential and outputs the amplified value as a T0 signal. The T0 signal is a DC voltage signal and indicates the magnitude of the correction voltage. In other words, the T0 signal is a signal indicating a change in the load voltage V5. Although the details will be described later, in the wireless power transmission system 100 of the first embodiment, the feeding power is controlled so as to make the correction voltage be zero to thereby stabilize the output voltage (load voltage V5).

The signal transmission circuit 122 converts the T0 signal as the DC voltage signal into a T1 signal as an AC light signal. The T1 signal is an "output signal" indicating the magnitude of output and received by the signal receiving circuit 112 of the wireless power feeder 116. The power feeding side can recognize the magnitude of the correction voltage based from the T1 signal. A circuit configuration and processing of the signal transmission circuit 122 will be described later using FIGS. 6 and 7. A circuit configuration and processing of the signal receiving circuit 112 will be described later using FIGS. 8 and 9.

A configuration of the power transmission control circuit 200 will be described. A VCO (Voltage Controlled Oscillator) 202 is connected to the primary side of the gate-drive transformer T1. The VCO 202 functions as an "oscillator" that generates AC voltage Vo at the drive frequency fo. Although the waveform of the AC voltage Vo may be a sine wave, it is assumed here that the voltage waveform is a rectangular wave (digital wave). The AC voltage Vo causes current to flow in a transformer T1 primary coil Lh alternately in both positive and negative directions. A transformer T1 primary coil Lh, a transformer T1 secondary coil Lf, and a transformer T1 secondary coil Lg constitute a gate-drive coupling transformer T1. Electromagnetic induction causes current to flow also in the transformer T1 secondary coil Lf and transformer T1 secondary coil Lg alternately in both positive and negative directions.

As the VCO 202 in the first embodiment, a built-in unit (product serial number MC14046B) manufactured by Motorola, Inc is used. The VCO 202 also has a function of dynamically changing the drive frequency fo based on phase difference indicating voltage SC fed from the phase detection circuit 150 (described later in detail).

The following description will be made assuming that the minimum value fo1 of the drive frequency fo is 90 kHz, and the maximum value fo2 thereof is 99 kHz. The appropriate range of the phase difference indicating voltage SC is 1.0 (V) to 4.0 (V). The phase difference indicating voltage SC and drive frequency fo are directly proportional to each other. That is, when the phase difference indicating voltage SC is 1.0 (V), the drive frequency fo (=fo1) is 90 kHz, and when the phase difference indicating voltage SC is 4.0 (V), the drive frequency fo (=fo2) is 99 kHz.

Capacitors CA and CB charged by a DC power supply Vdd each serve as a power supply for the power transmission control circuit 200. The capacitor CA is provided between points C and E of FIG. 1, and capacitor CB is provided between points E and D. Assuming that the voltage (voltage between points C and E) of the capacitor CA is VA, voltage (voltage between points E and D) of the capacitor CB is VB, VA+VB (voltage between points C and D) represents input voltage. That is, the capacitors CA and CB each function as a DC voltage supply.

One end of the transformer T1 secondary coil Lf is connected to the gate of a switching transistor Q1, and the other end of the transformer T1 secondary coil Lf is connected to the source of a switching transistor Q1. One end of the transformer T1 secondary coil Lg is connected to the gate of a switching transistor Q2, and the other end of the transformer T1 secondary coil Lg is connected to the source of a switching transistor Q2. When VCO 202 generates AC voltage Vo at drive frequency fo, voltage Vx (Vx>0) is alternately applied, at drive frequency fo, to the gates of the switching transistors Q1 and Q2. As a result, the switching transistors Q1 and Q2 are alternately turned on/off at the drive frequency fo. The switching transistors Q1 and Q2 are enhancement type MOS-FET (Metal Oxide Semiconductor Field effect transistor) having the same characteristics but may be other transistors such as a bipolar transistor. Further, other switches such as a relay switch may be used in place of the transistor.

The drain of the switching transistor Q1 is connected to the positive electrode of the capacitor CA. The negative electrode of the capacitor CA is connected to the source of the switching transistor Q1 through the transformer T2 primary coil Lb. The source of the switching transistor Q2 is connected to the negative electrode of the capacitor CB. The positive electrode of the capacitor CB is connected to the drain of the switching transistor Q2 through the transformer T2 primary coil Lb.

Voltage between the source and drain of the switching transistor Q1 is referred to as source-drain voltage VDS1, and voltage between the source and drain of the switching transistor Q2 is referred to as source-drain voltage VDS2. Current flowing between the source and drain of the switching transistor Q1 is referred to as source-drain current IDS1, and current flowing between the source and drain of the switching transistor Q2 is referred to as source-drain current IDS2. The directions of arrows in the diagram indicate the positive directions, and directions opposite to the directions of the arrows indicate the negative directions.

When the switching transistor Q1 is turned conductive (ON), the switching transistor Q2 is turned non-conductive (OFF). A main current path (hereinafter, referred to as "first current path") at this time extends from the positive electrode of the capacitor CA, passes through the point C, switching transistor Q1, transformer T2 primary coil Lb, and point E in this order, and returns to the negative electrode of the capacitor CA. The switching transistor Q1 functions as a switch for controlling conduction/non-conduction of the first current path.

When the switching transistor Q2 is turned conductive (ON), the switching transistor Q1 is turned non-conductive (OFF). A main current path (hereinafter, referred to as "second current path") at this time extends from the positive electrode of the capacitor CB, passes through the point E, transformer T2 primary coil Lb, switching transistor Q2, and point D in this order, and returns to the negative electrode of the capacitor CB. The switching transistor Q2 functions as a switch for controlling conduction/non-conduction of the second current path.

Current flowing in the transformer T2 primary coil Lb in the power transmission control circuit 200 is referred to as "current IS". The current IS is AC current, and the current flow in a first current path is defined as the positive direction and current flow in a second current path is defined as the negative direction.

When the VCO 202 feeds the AC voltage Vo at the drive frequency fo, the first and second current paths are switched at the drive frequency fo. Since the AC current Is of the drive frequency fo flows in the transformer T2 primary coil Lb, the AC current I1 flows in the exciting circuit 110 at the drive frequency fo, and the AC current I2 of the drive frequency fo flows in the feeding circuit 120. The closer the value of the drive frequency fo is to the resonance frequency fr, the higher the power transmission efficiency becomes. When the drive frequency fo is equal to the resonance frequency fr, the feeding coil L2 of the feeding coil circuit 120 and capacitor C2 are in a resonance state. The receiving coil circuit 130 is also a resonance circuit of the resonance frequency fr, so that the feeding coil L2 and receiving coil L3 magnetically resonate. At this time, the maximum transmission efficiency can be obtained.

In the case of the first embodiment, however, the resonance frequency fr is not included in the operating range of the drive frequency fo, so that the power transmission efficiency does not reach the maximum value. This is because priority is given to the stability of the load voltage V5 over the maximization of the power transmission efficiency. A change in the load voltage V5 can be detected from the correction voltage, so that the wireless power feeder 116 automatically adjusts the drive frequency fo so as to make the correction voltage be zero. The details will be described later.

The resonance frequency fr slightly changes depending on use condition or use environment of the feeding coil circuit 120 or receiving coil circuit 130. Further, in the case where the feeding coil circuit 120 or receiving coil circuit 130 is replaced with new one, the resonance frequency fr changes. Alternatively, there may be case where the resonance frequency needs to be changed aggressively by setting the electrostatic capacitance of the capacitor C2 or capacitor C3 variable. Further, according to the experiment made by the present inventor, it has been found that the resonance frequency starts falling when the distance between the feeding coil L2 and receiving coil L3 is made smaller to some extent. When the difference between the resonance frequency fr and drive frequency fo changes, the power transmission efficiency changes. When the power transmission efficiency changes, the load voltage V5 also changes. Therefore, in order to stabilize the load voltage V5, it is necessary to keep the difference between the resonance frequency fr and the drive frequency fo constant even if the resonance frequency fr changes.

The wireless power transmission system 100 in the first embodiment has a drive frequency tracking function of making the drive frequency fo automatically track a change of the resonance frequency fr.

The phase detection circuit 114 includes a current phase detection circuit 144, a phase comparison circuit 150, and a low-pass filter 152. The low-pass filter 152 is a circuit in which a resistor R3 and a capacitor C6 are connected in series and cuts a high-frequency component of the phase difference indicating voltage SC. As the phase comparison circuit 150 in the first embodiment, a built-in unit (Phase Comparator) (product serial number MC14046B) manufactured by Motorola is used, as in the case of the VCO 202. Thus, the phase comparison circuit 150 and VCO 202 can be implemented in one chip.

The current phase detection circuit 144 generates an S1 signal as a signal indicating a current phase. The S1 signal is input to the phase comparison circuit 150. The AC voltage Vo generated by the VCO 202 is input to the phase comparison circuit 150 as an S0 signal indicating a voltage phase. The phase comparison circuit 150 detects a deviation (phase difference) between the current phase and voltage phase from the S0 and S1 signals and generates the phase difference indicating voltage SC indicating the magnitude of the phase difference. Detecting the phase difference allows detection of the magnitude of the deviation between the resonance frequency fr and drive frequency fo. It is possible to keep the phase difference between the drive frequency fo and the resonance frequency fr constant by controlling the drive frequency fo according to the phase difference indicating voltage SC.

For example, when the drive frequency fo and resonance frequency fr deviate from each other, the phase difference is accordingly increased, so that the phase comparison circuit 150 generates the phase difference indicating voltage SC so as to reduce the phase difference. Thus, even if the resonance frequency fr changes, it is possible to keep the power transmission efficiency constant to thereby stabilize the load voltage V5. A circuit configuration of the current phase detection circuit 144 will be described later using FIG. 10, and relationship between the S0 and S1 signals will be described later using FIGS. 11 and 12.

The S0 signal may be obtained by connecting resistors to both ends of the transformer T1 primary coil Lh in parallel to divide the AC voltage Vo. Even in the case where the AC voltage Vo generated by the VCO 202 is large, the AC voltage can be reduced to a manageable level by the voltage division. The voltage phase may be measured from the source-drain voltages VDS1 and VDS2 or source-gate voltages VGS1 and VGS2.

Even though the resonance frequency fr is constant, the load voltage V5 may be changed in some cases. For example, in the case where the load LD is a variable resistor or in the case where the load LD is replaced with new one, the load voltage V5 changes. In the first embodiment, a change in the load voltage V5 is detected as the correction voltage, and the drive frequency fo is automatically adjusted so as to make the correction voltage be zero, whereby the load voltage V5 is stabilized.

The correction voltage is transmitted from the signal transmission circuit 122 to signal receiving circuit 112 as the T1 signal (AC light signal). The signal receiving circuit 112 converts the T1 signal as the AC light signal into T2 signal as the DC voltage signal. The voltage level of the T2 signal is directly proportional to the correction voltage.

The current phase detection circuit 144 adjusts an S2 signal (AC voltage signal) indicating a current phase by using the T2 signal (DC voltage signal) indicating the correction voltage and outputs the S1 signal (AC voltage signal) as a correction current phase. When the T2 signal is zero, that is, when the load voltage V5 assumes a desired value, the S2 signal directly becomes the S1 signal. The phase comparison circuit 150 detects the phase difference between the voltage phase and current phase of the AC power based on the S0 and S1 signals and outputs the phase difference indicating voltage SC. The VCO 202 adjusts the drive frequency fo based on the phase difference indicating voltage SC. More specifically, the VCO 202 changes the pulse width of the AC voltage Vo to thereby change the drive frequency fo.

Also, when the correction voltage, i.e., T2 signal is not zero, the phase comparison circuit 150 detects the phase difference between the voltage phase and current phase of the AC power based on the S0 and S1 signals and outputs the phase difference indicating voltage SC. However, the S1 signal at this time is a signal obtained by correcting the S2 signal in accordance with the T2 signal, so that the S1 signal does not indicate the actual current phase. The adjustment logic based on the correction voltage will be described later using FIG. 11.

A detection coil LSS is provided at the feeding coil circuit 120. The detection coil LSS is a coil wounded around a core 154 (toroidal core) having a penetration hole NS times. The core 154 is formed of a known material such as ferrite, silicon steel, or permalloy. The number of windings NS of the detection coil LSS in the present embodiment is 100.

A part of the current path of the feeding coil circuit 120 penetrates the penetration hole of the core 154. This means that the number of windings NP of the feeding coil circuit 120 with respect to the core 154 is one. With the above configuration, the detection coil LSS and feeding coil L2 constitute a coupling transformer. An AC magnetic field generated by the AC current I2 of the feeding coil L2 causes inductive current ISS having the same phase as that of the current I2 to flow in the detection coil LSS. The magnitude of the inductive current ISS is represented by I2·(NP/NS) according to the law of equal ampere-turn.

A resistor R4 is connected to both ends of the detection coil LSS. One end B of the resistor R4 is grounded. and the other end A thereof is connected to the phase detection circuit 144 through a comparator 142.

Potential VSS is digitized by the comparator 142 to be an S2 signal. The comparator 142 outputs a saturated voltage of 3.0 (V) when the potential VSS exceeds a predetermined threshold, e.g., 0.1 (V). Thus, the potential VSS is converted into the S2 signal of a digital waveform by the comparator 142. The current I2 and inductive current ISS have the same phase, and inductive current ISS and potential VSS (S2 signal) have the same phase. Further, the AC current Is flowing in the power transmission control circuit 200 have the same phase as that of the current I2. Therefore, by observing the waveform of the S2 signal, the current phase of the AC current Is can be measured.

Figure 2:
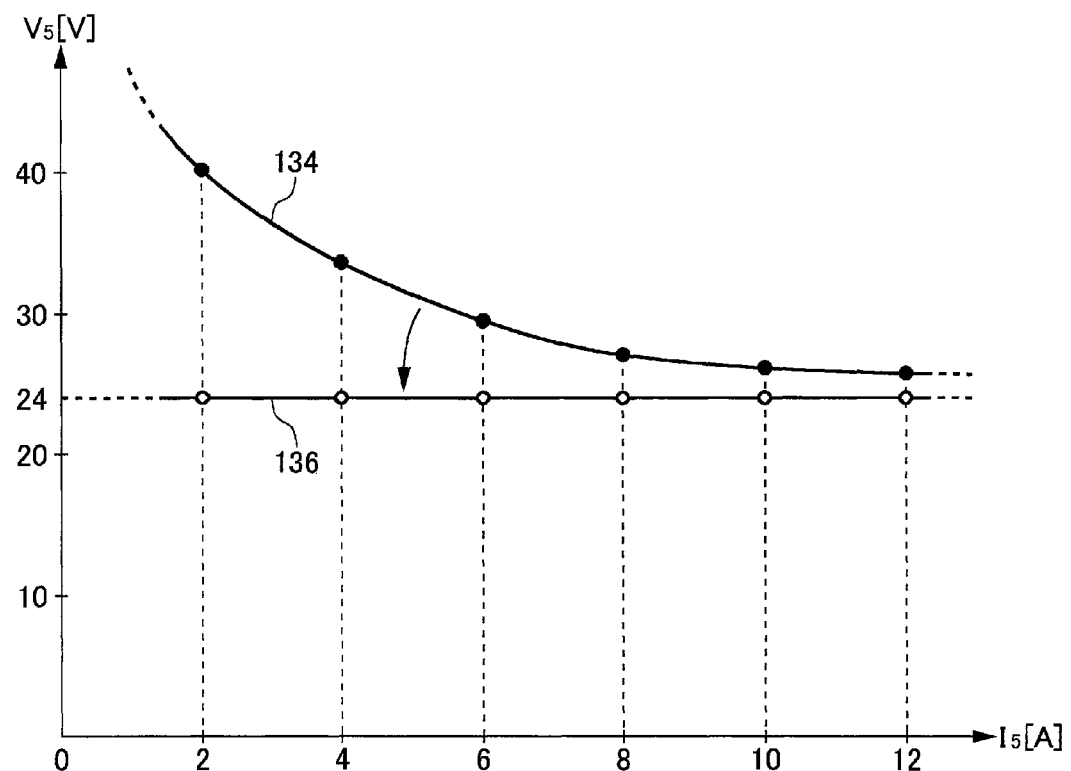
FIG. 2 is a graph illustrating a relationship between load current and load voltage.

FIG. 2 is a graph illustrating a relationship between load current I5 and load voltage V5. The horizontal axis represents the magnitude of the load current I5 (DC) flowing in the load LD, and the vertical axis represents the load voltage V5. A non-adjustment characteristic 134 represents a current-voltage characteristic obtained in the case where adjustment based on the correction voltage is not performed. In the case of the non-adjustment characteristic 134, when the load LD increases, the load current I5 decreases while the load voltage V5 increases. On the other hand, when the load LD decreases, the load current I5 increases while the load voltage V5 decreases. As described above, when the load LD changes, the load voltage V5 changes even when constant power is fed.

The wireless power transmission system 100 in the first embodiment achieves the current-voltage characteristic represented by an adjustment characteristic 136. To be specific, the S1 signal is adjusted based on the correction voltage to change the power transmission efficiency, whereby the load voltage V5 is stabilized.

Figure 3:
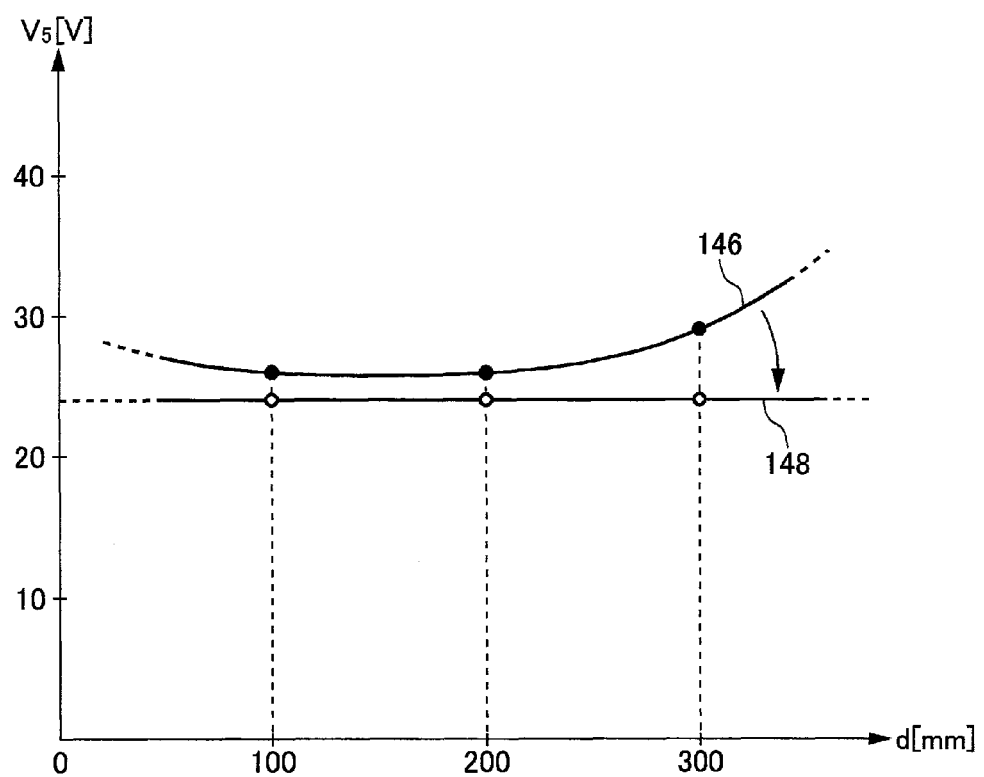
FIG. 3 is a graph illustrating inter-coil distance and load voltage.

FIG. 3 is a graph illustrating a relationship between inter-coil distance d and load voltage V5. The horizontal axis represents the inter-coil distance d between the feeding coil L2 and receiving coli L3, and the vertical axis represents the load voltage V5. A non-adjustment characteristic 146 represents a voltage-distance characteristic obtained in the case where adjustment based on the correction voltage is not performed. As describe above, the resonance frequency fr changes depending on the inter-coil distance d. When the resonance frequency fr changes to cause the difference between the drive frequency fo and resonance frequency fr to change, the power transmission efficiency changes. Even when the drive frequency fo is made to track the resonance frequency fr, the load voltage V5 changes to a certain degree depending on the inter-coil distance d.

The wireless power transmission system 100 in the first embodiment achieves the voltage-distance characteristic represented by an adjustment characteristic 148. That is, the S1 signal is adjusted based on the correction voltage to change the power transmission efficiency, whereby the load voltage V5 is stabilized.

Figure 4:
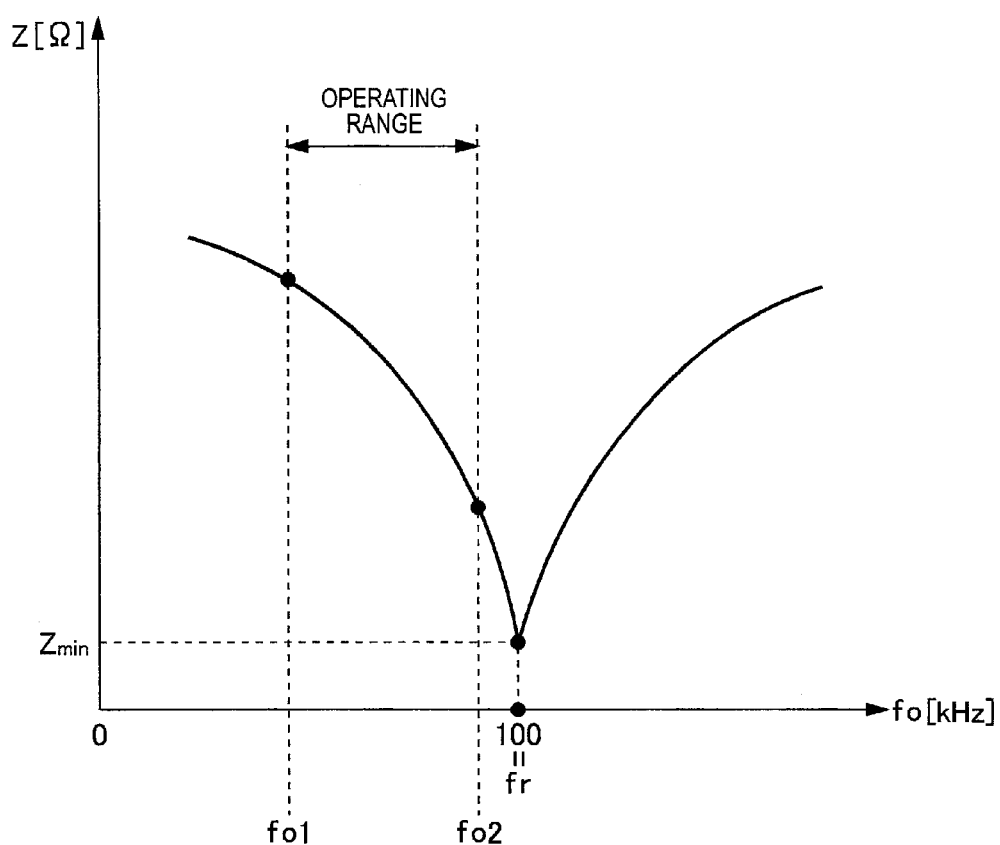
FIG. 4 is a graph illustrating a relationship between the impedance of a feeding coil circuit and drive frequency.

FIG. 4 is a graph illustrating a relationship between the impedance Z of the feeding coil circuit 120 and drive frequency fo. The vertical axis represents the impedance Z of the feeding coil circuit 120 (a circuit in which the capacitor C2 and the feeding coil L2 are connected in series). The horizontal axis represents the drive frequency fo. The impedance Z is a minimum value Zmin at the resonance state. Although Zmin=0 at the resonance state is ideal, Zmin does not become zero in general since some resistance components are included in the feeding coil circuit 120.

When the drive frequency fo and resonance frequency fr coincide with each other, the impedance Z becomes minimum and the capacitor C2 and the feeding coil L2 are in a resonance state. When the drive frequency fo and resonance frequency fr deviate from each other, one of the capacitive reactance and inductive reactance prevails the other, so that the impedance Z is also increased.

The impedance Z increases as the deviation from the drive frequency fo and resonance frequency fr advances, with the result that the power transmission efficiency is degraded. That is, it is possible to change the power transmission efficiency by changing the difference between the drive frequency fo and resonance frequency fr.

Figure 5:
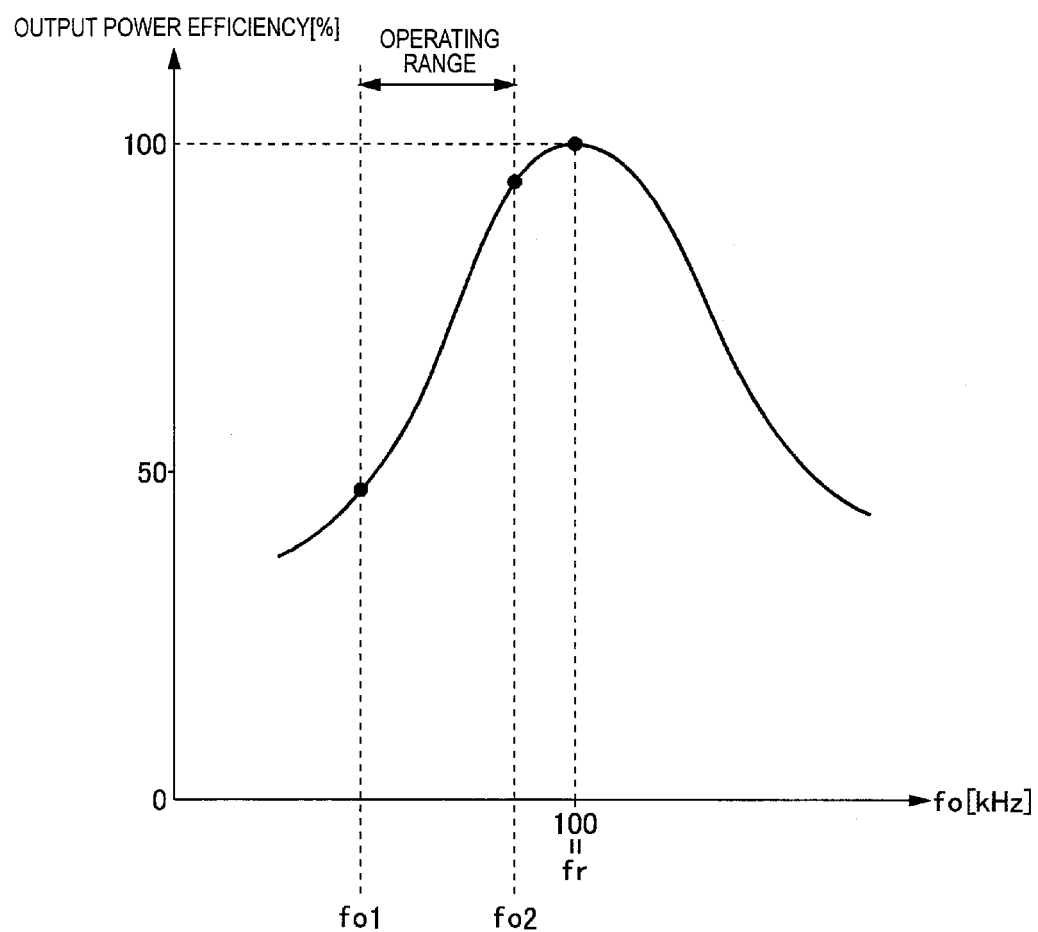
FIG. 5 is a graph illustrating a relationship between output power efficiency and drive frequency.

FIG. 5 is a graph illustrating a relationship between the output power efficiency and drive frequency fo. The output power efficiency is a ratio of power actually fed from the feeding coil L2 relative to the maximum output value. When the drive frequency fo coincides with the resonance frequency fr, a difference between the current phase and voltage phase becomes zero and therefore the power transmission efficiency becomes maximum, with the result that output power efficiency of 100(%) can be obtained. In the wireless power transmission system 100 of the first embodiment, the drive frequency fo is adjusted in a range of fo1 to fo2 which is lower than the resonance frequency fr.

Figure 6:
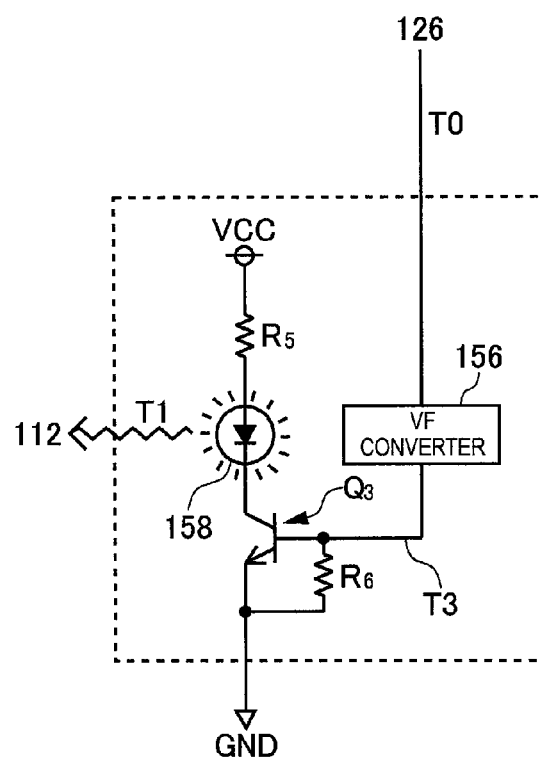
FIG. 6 is a circuit diagram of a signal transmission circuit in the first embodiment.

FIG. 6 is a circuit diagram of the signal transmission circuit 122 in the first embodiment. The signal transmission circuit 122 includes an infrared ray LED (Light Emitting Diode) 158, a transistor Q3, and a VF converter 156. The transistor Q3 is an emitter-grounded bipolar transistor, and the base and emitter thereof are connected through a resistor R6. One end of the infrared ray LED 158 is connected to the power supply VCC through the resistor R5, and the other end thereof is connected to the collector of the transistor Q3. The VF converter 156 is also connected to the base of the transistor Q3.

Figure 7:
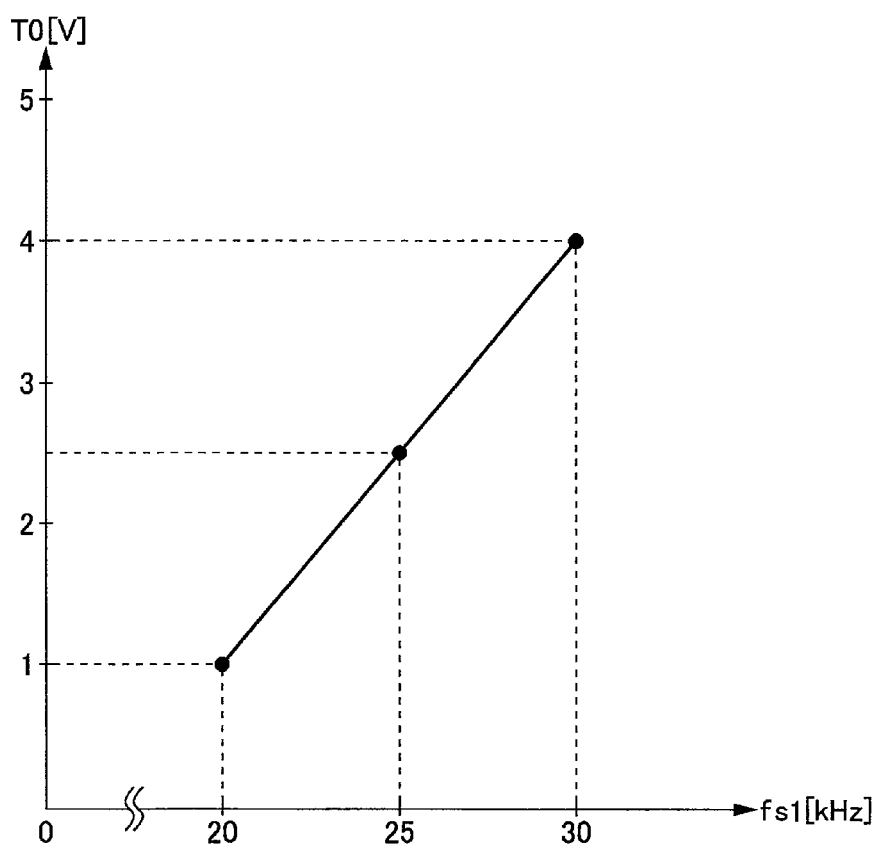
FIG. 7 is a graph illustrating a relationship between the signal frequency in a VF converter and a T0 signal.

The measurement circuit 126 transmits the T0 signal (DC voltage signal) indicating the correction voltage to the VF converter 156. The VF converter 156 generates a T3 signal (AC voltage signal) which is a pulse signal having a duty ratio of 50%. A signal frequency fs1 of the T3 signal changes depending on the T0 signal (correction voltage). FIG. 7 is a graph illustrating a relationship between the signal frequency fs1 in the VF converter 156 and T0 signal.

The T3 signal (AC voltage signal) is changed into the T1 signal (AC light signal) by the infrared ray LED 158. The infrared ray LED 158 transmits the T1 signal (AC light signal) to the signal receiving circuit 112. The T1 signal is a light signal (infrared ray signal) that blinks at the signal frequency fs1. The wavelength of the T1 signal is about 940 nm. The T1 signal travels up to several meters, so that there occurs no problem even if the inter-coil distance d is large. Further, the infrared ray is hardly subject to the magnetic field generated by the feeding coil L2, an advantage that the T1 signal and feeding power hardly interact with each other can be obtained.

Figure 8:
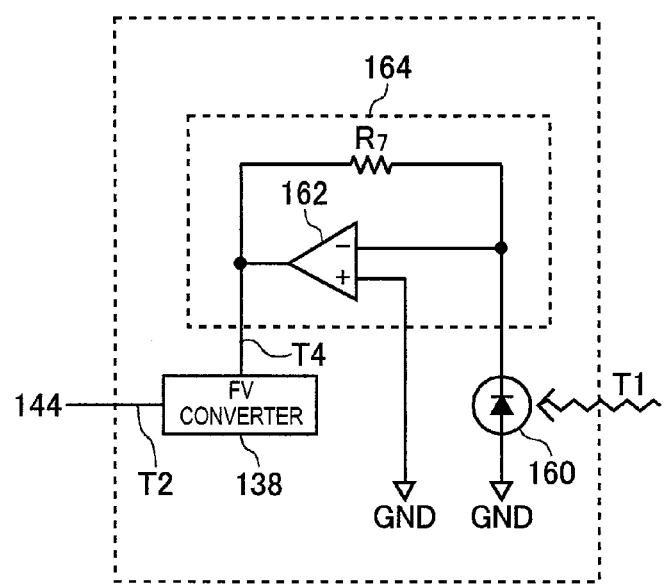
FIG. 8 is a circuit diagram of a signal receiving circuit in the first embodiment.

FIG. 8 is a circuit diagram of the signal receiving circuit 112 in the first embodiment. The signal receiving circuit 112 includes a photodiode 160, a voltage conversion section 164, and an FV converter 138. The voltage conversion section 164 includes a comparator 162 and a resistor R7.

Figure 9:
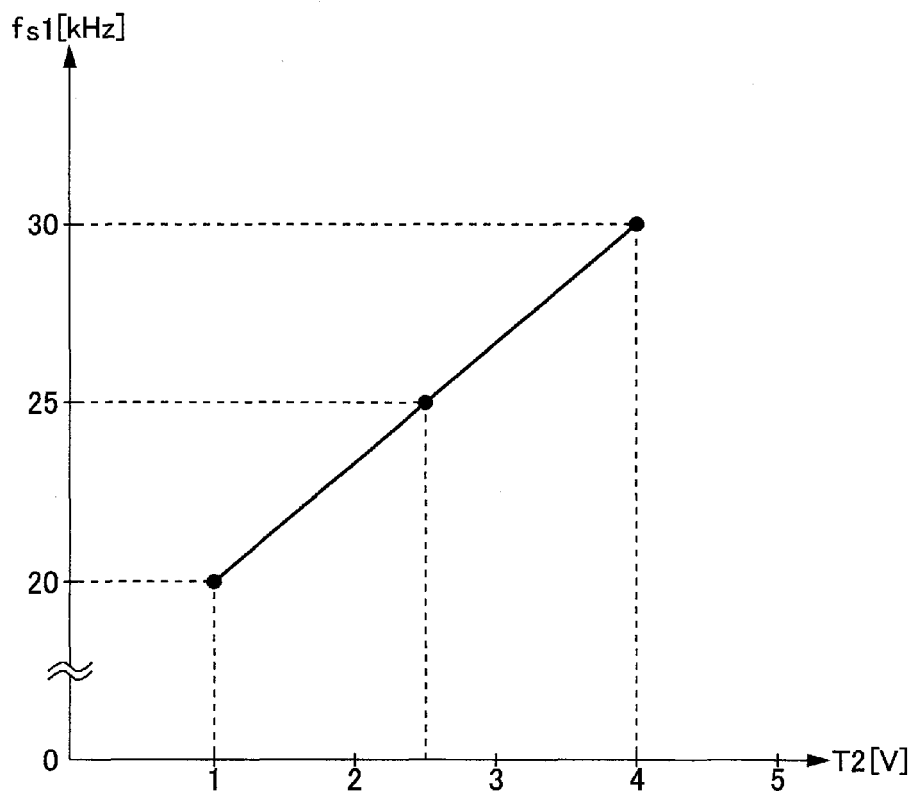
FIG. 9 is a graph illustrating a relationship between signal frequency in an FV converter and a T2 signal.

The photodiode 160 receives the T1 signal (AC light signal) of the signal frequency fs1. The T1 signal (AC light signal) is converted into a T4 signal (AC voltage signal) by the voltage conversion section 164. In the voltage conversion section 164, the resistor R7 is adjusted in the way output 1 (mV) per 1 lux. The brightness of the T1 signal at the reception time is about 0 to 2000 (lux) and, accordingly, the voltage level of the T4 signal is 0 to 2.0 (V). The T4 signal is a pulse-like voltage signal changing at the signal frequency fs1. The duty ratio of the T4 signal is 50%. The T4 signal (AC voltage signal) is converted into the fixed T2 value (DC voltage signal) by the FV converter 138. FIG. 9 is a graph illustrating a relationship between the signal frequency fs1 in the FV converter 138 and T2 signal. The higher the signal frequency fs1, the higher the voltage level of the T2 signal is set.

Figure 10:
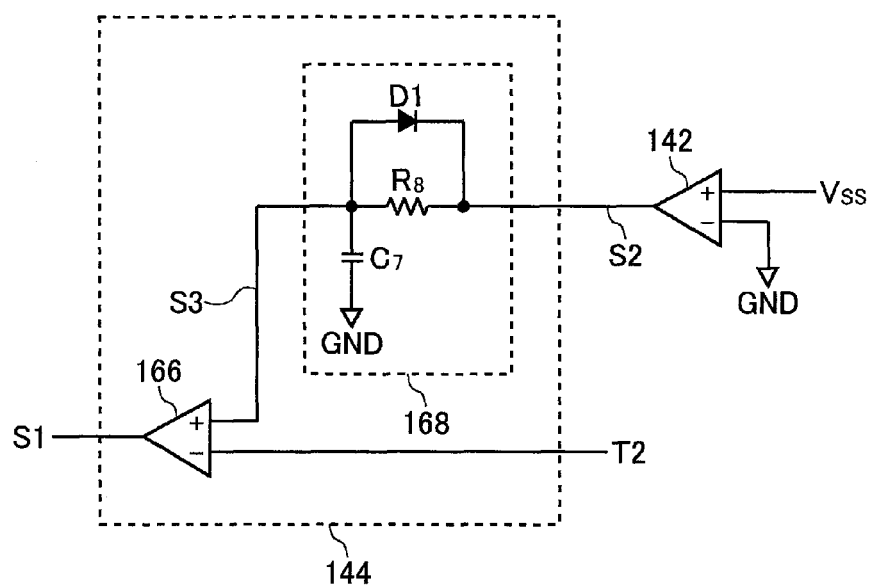
FIG. 10 is a circuit diagram of a current phase detection circuit in the first embodiment.

FIG. 10 is a circuit diagram of the current phase detection circuit 144 in the first embodiment. The current phase detection circuit 144 includes a comparator 166 and a current waveform shaping circuit 168. The potential VSS is shaped into the S2 signal of a digital waveform by the comparator 142 and input to the current waveform shaping circuit 168. The current waveform shaping circuit 168 shapes the S2 signal of a digital waveform (rectangular waveform) into an S3 signal of a saw-tooth waveform. In the current waveform shaping circuit 168, a resistor R8 is inserted in the path of the S2 signal, and a diode D1 is connected in parallel to the resistor R8. The transmission path of the S2 signal is grounded through a capacitor C7.

The S3 signal (AC voltage signal) is input to the positive terminal of the comparator 166, and T2 signal (DC voltage signal) output from the signal receiving circuit 112 is input to the negative terminal of the comparator 166. The S3 signal is a signal indicating a current phase, and T2 signal is a DC voltage signal indicating the correction voltage.

The comparison 166 outputs a high-level S1 signal when the level of the S3 signal is higher than that of the S2 signal while it outputs a low-level S1 signal in the rest of the time. The actual output wavelength will be described in detail later using FIG. 11 and subsequent drawings.

Figure 11:
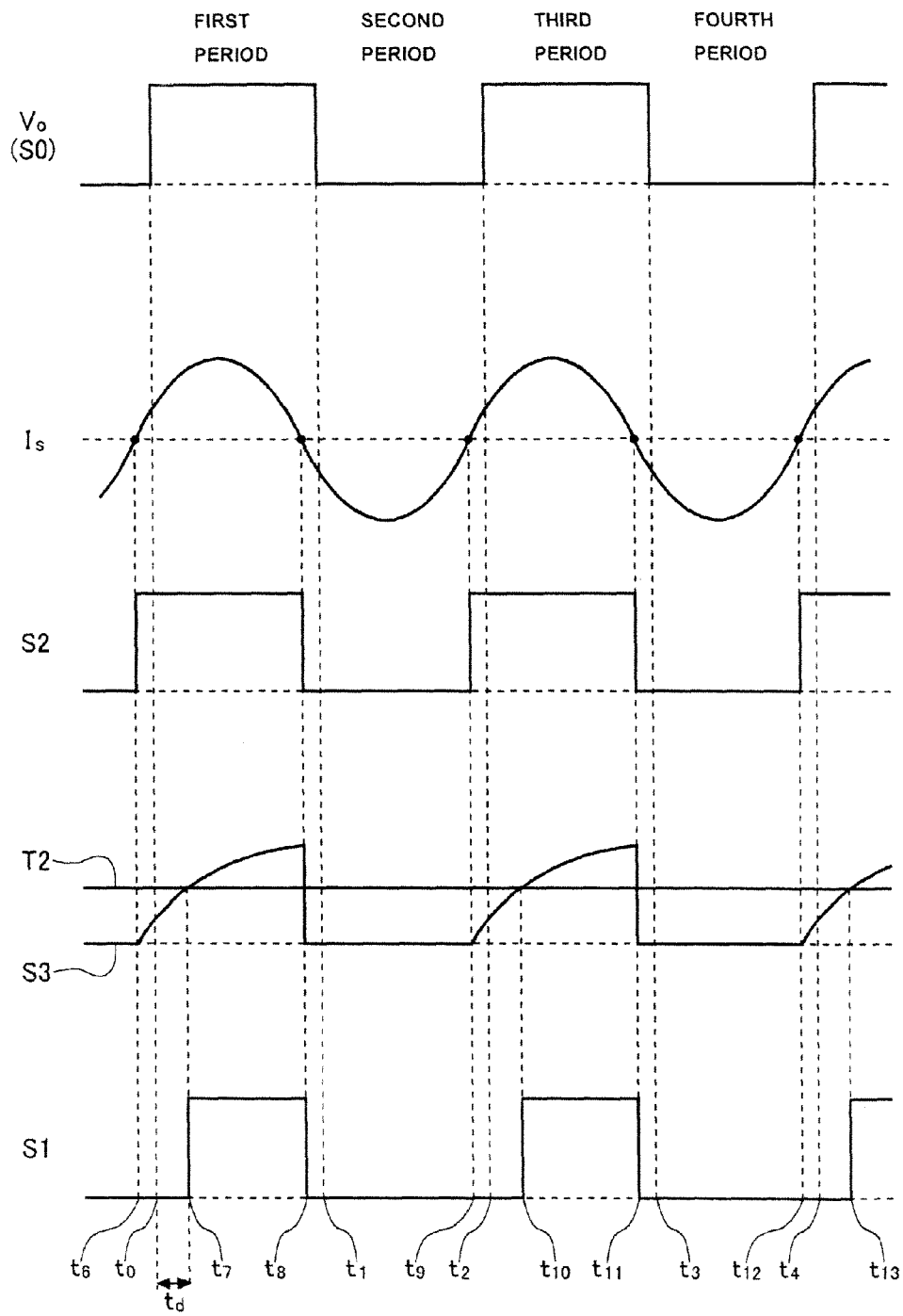
FIG. 11 is a time chart illustrating a relationship between S0 and S1 signals.

FIG. 11 is a time chart illustrating a relationship between the S0 signal and S1 signal. Time period from time t0 to time t1 (hereinafter, referred to as "first period") is a time period during which the switching transistor Q1 is ON while the switching transistor Q2 is OFF. Time period from time t1 to time t2 (hereinafter, referred to as "second period") is a time period during which the switching transistor Q1 is OFF while the switching transistor Q2 is ON. Time period from time t2 to time t3 (hereinafter, referred to as "third period") is a time period during which the switching transistor Q1 is ON while the switching transistor Q2 is OFF. Time period from time t3 to time t4 (hereinafter, referred to as "fourth period") is a time period during which the switching transistor Q1 is OFF while the switching transistor Q2 is ON.

At time t0, the AC voltage Vo (S0 signal) changes from the minimum value of 0.0 (V) to the maximum value of 3.0 (V). At time t1 at which the first time period is ended, the AC voltage Vo (S0 signal) changes from the maximum value of 3.0 (V) to the minimum value of 0.0 (V). Hereinafter, a timing (represented by, e.g., time t0) at which the S0 signal rises is referred to as "voltage phase value".

In the case where the drive frequency fo is lower than the resonance frequency fr, a capacitive reactance component appears in the impedance Z of the feeding coil circuit 120 (LC resonance circuit), and the current phase of the current Is advances with respect to the voltage phase. Thus, the S2 signal indicating a current phase rises at time t6 which is earlier than time t0. Hereinafter, a timing (represented by, e.g., time t6) at which the S2 signal rises is referred to as "current phase value". In the example of FIG. 11, a value obtained by t0−t6 represents the phase difference. Here, t0−t6>0 is established, so that the current phase advances with respect to the voltage phase.

When the S2 signal rises at time t6, the level of the S3 signal starts increasing. At time t8 at which the level of the S2 signal becomes zero, the level of the S3 signal also abruptly decreases from the maximum value of 3.0 (V) to 0.0 (V).

The T2 signal is a DC voltage signal whose level changes depending on the magnitude of the correction voltage. In FIG. 11, the correction voltage is detected, that is, the load voltage V5 deviates from a desired value.

The S3 signal and T2 signal are input to the positive terminal and negative terminals of the comparator 166, respectively, and the S1 signal is output from the comparator 166. During the period during which the level of the S3 signal is higher than that of T3 signal (S3>T3), the level of the S1 signal is higher than 0 (S1>0), while in the rest of time, the level of the S1 signal is 0 (S1=0). In FIG. 11, the level of the S3 signal is higher than that of the T3 (S3>T3) at time t7 (hereinafter, such a timing is referred to also as "corrected current phase value") which is later than time to. The voltage level of the T2 signal serves as a "reference value" for determining the corrected current phase value.

The phase comparison circuit 150 compares rising edge time t0 of the S0 signal and rising edge time t7 of the S1 signal to calculate the phase difference td. Although the actual phase difference is t0−t6 (>0), the phase difference recognized by the phase comparison circuit 150 is obtained by t0−t7 (<0). The phase comparison circuit 150 outputs the phase difference indicating voltage SC corresponding to a value obtained by t0−t7. The VCO 202 determines that the current phase delays with respect to the voltage phase, that is, the drive frequency fo is higher than the resonance frequency fr and tries to eliminate the phase difference by reducing the drive frequency fo. As a result, feedback control is executed such that the power transmission efficiency is degraded, the load voltage V5 is reduced, and the correction voltage is eliminated.

Figure 12:
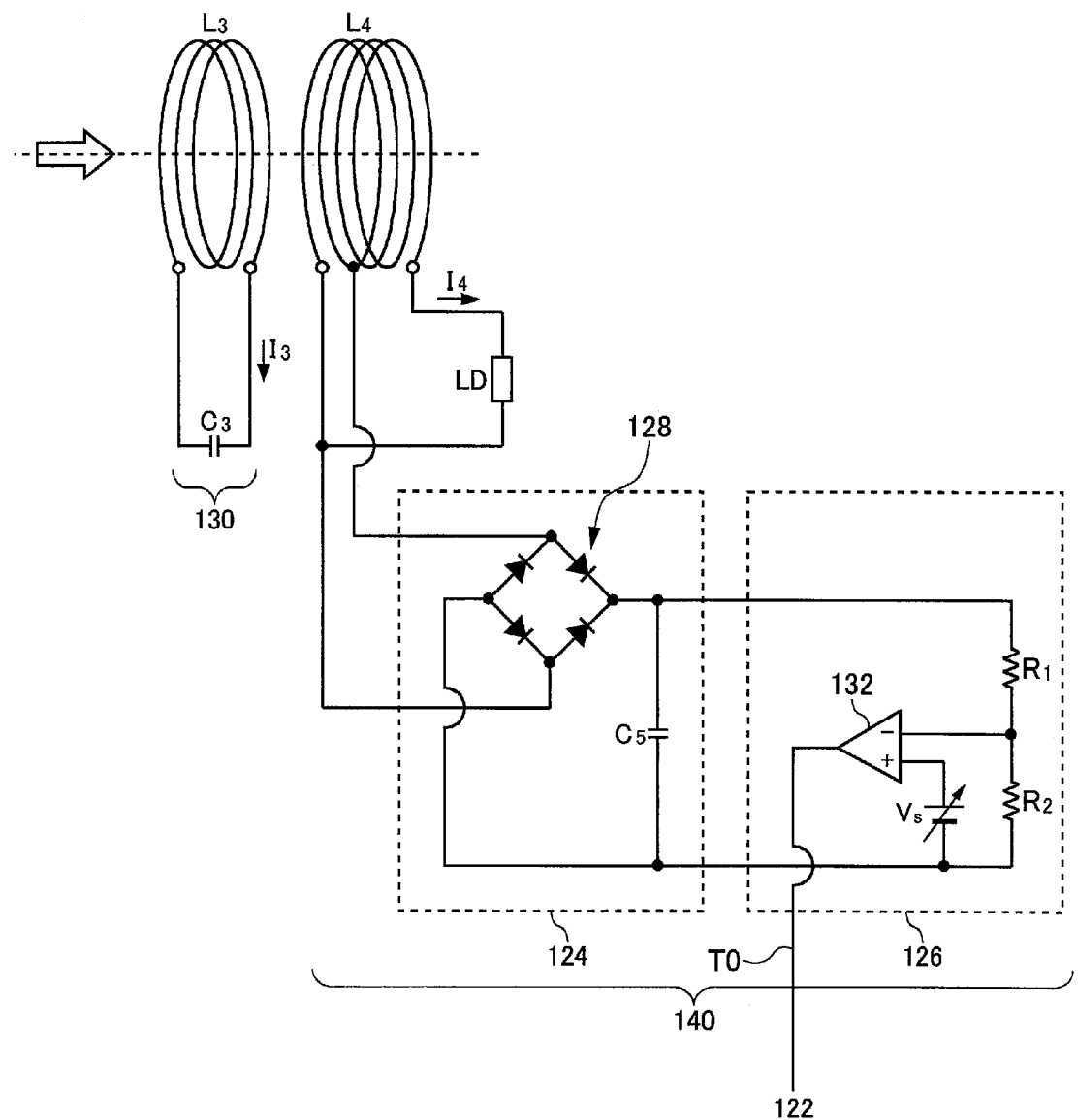
FIG. 12 is a circuit diagram illustrating a modification example of a wireless power receiver in the first embodiment.

FIG. 12 is a circuit diagram illustrating a modification example of the wireless power receiver 118 in the first embodiment. Although the DC current I5 is fed to the load LD in FIG. 1, the AC current I4 may directly be fed to the load LD in the modification example. In this case, the rectification circuit 124 and measurement circuit 126 are connected to a part of the load coil L4 so as to allow the T0 signal to be output.

Figure 13:
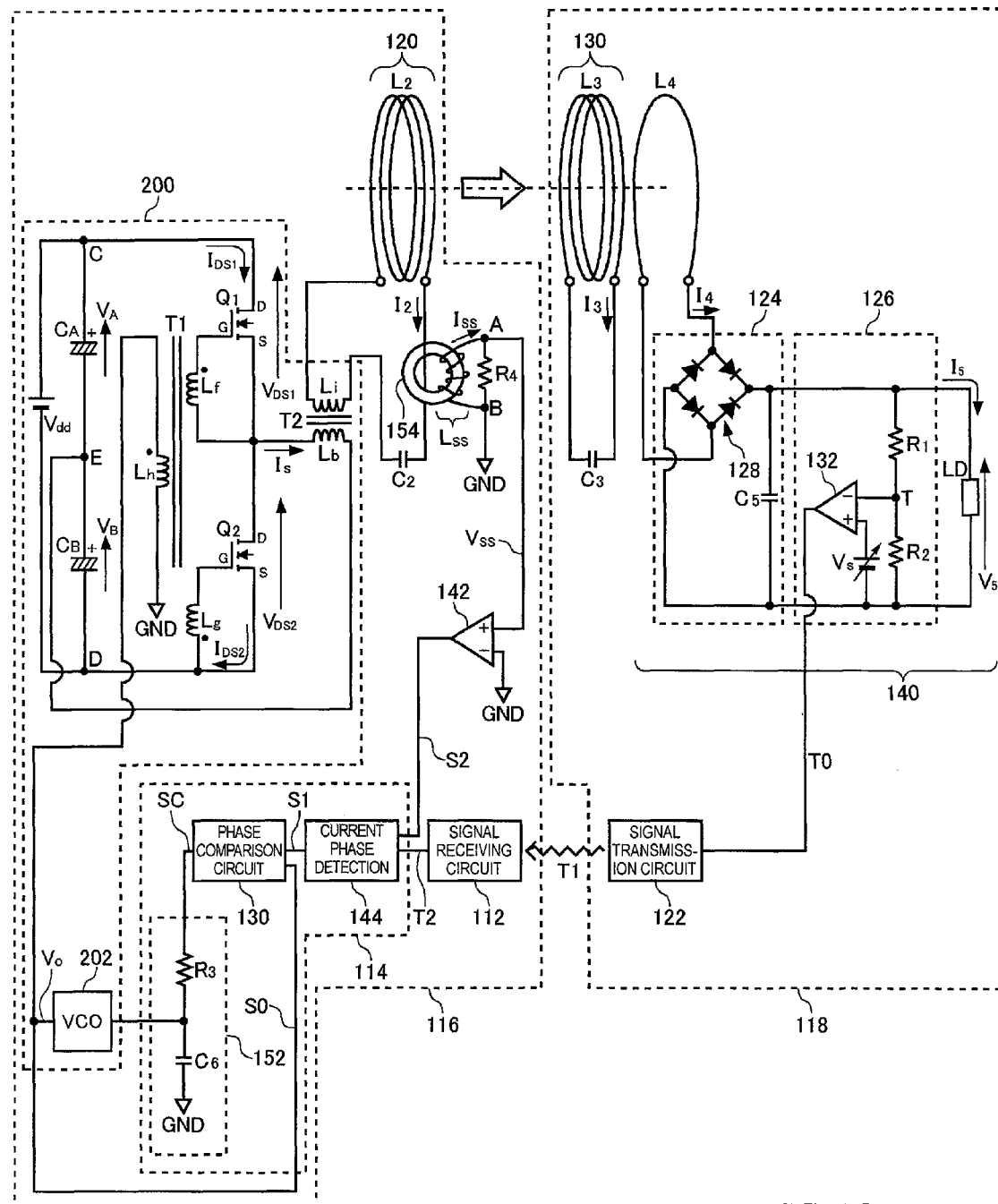
FIG. 13 is a system configuration view illustrating a modification example of the wireless power transmission system in the first embodiment.

FIG. 13 is a system configuration view of a wireless power transmission system 100 which is a modification of the first embodiment. In the wireless power transmission system 100 of the modification, the power transmission control circuit 200 directly drives the feeding coil circuit 120 without intervention of the exciting circuit 110. Components designated by the same reference numerals as those of FIG. 1 have the same or corresponding functions as those in FIG. 1.

The feeding coil circuit 120 in the modification is a circuit in which the transformer T2 secondary coil Li is connected in series to the feeding coil L2 and capacitor C2. The transformer T2 secondary coil Li constitutes a coupling transformer T2 together with the transformer T2 primary coil Lb and receives AC power from the power transmission control circuit 200 by electromagnetic induction. Thus, the AC power may be directly fed from the power transmission control circuit 200 to the feeding coil circuit 120 without intervention of the exciting circuit 110.

Although the power transmission control circuit 200 is a half-bridge type circuit, it may be constructed as a push-pull type circuit. The S3 signal generated by the current waveform shaping circuit 168 may be an AC signal having not only a saw-tooth waveform but also a triangle wave or a sine wave in which a voltage value is gradually increased or decreased within a predetermined time period. Although the current phase is set as an adjustment target in the first embodiment, the voltage phase may be adjusted based on the T0 signal. Further, the feedback control may be effected based not only on the output voltage but on the current or power.

Although the signal frequency fs1 of the T1 signal (AC light signal) indicates the correction voltage in the first embodiment, the correction voltage may be represented by the amplitude or duty ratio of the T1 signal. Alternatively, numerical information indicating the correction voltage may be transmitted as a digital signal. The T1 signal is not limited to a light signal such as an infrared ray but may be a radio signal. At any rate, it is only necessary for the T1 signal to have a frequency band sufficiently away from the frequency band of the drive frequency fo or resonance frequency fr. The infrared ray LED 158 and photodiode 160 are comparatively low in price, so that the light signal is adopted in the first embodiment.

[Second Embodiment]

Figure 14:
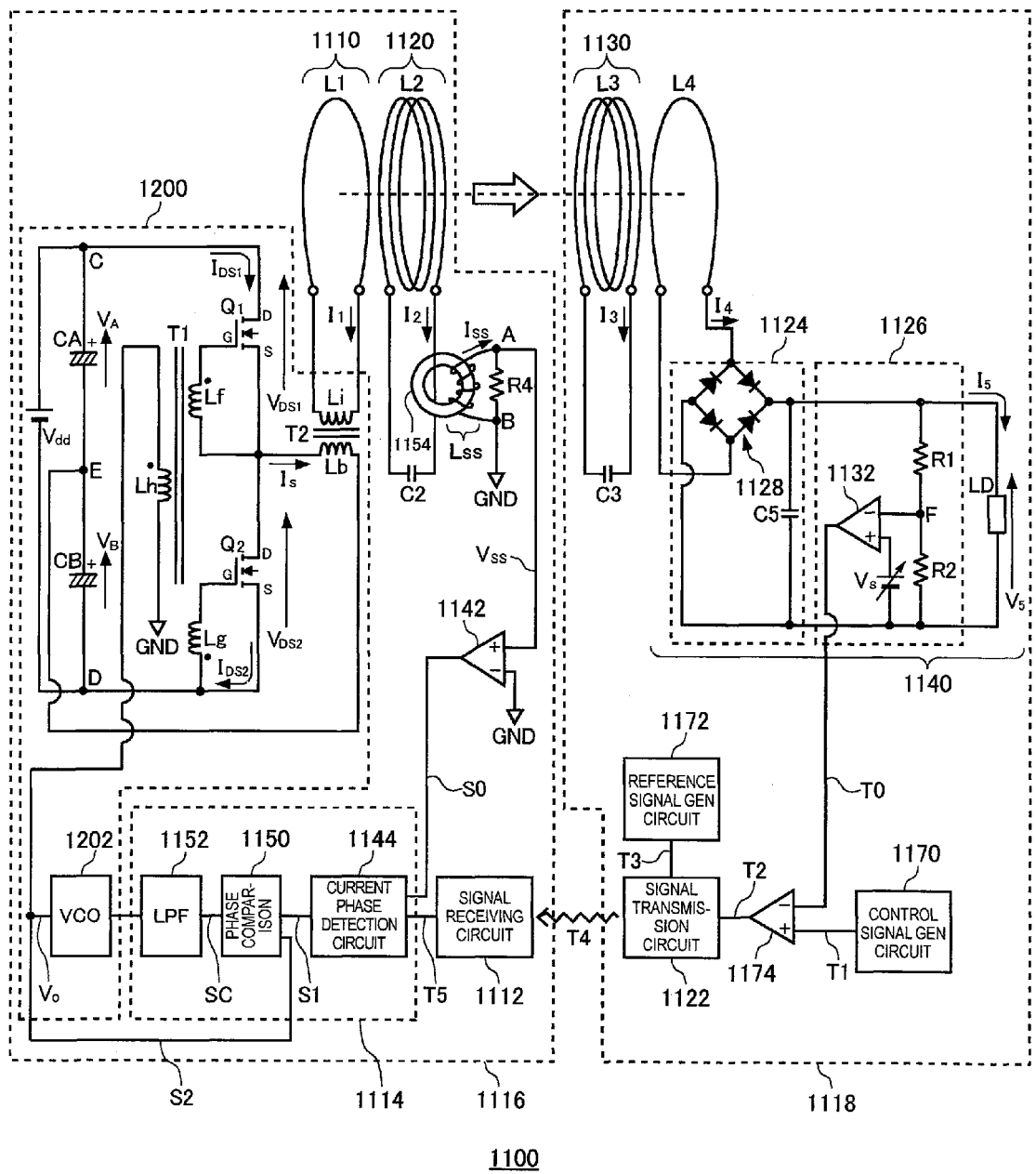
FIG. 14 is a system configuration view of a wireless power transmission system in a second embodiment.

FIG. 14 is a system configuration view of a wireless power transmission system 1100 according to the second embodiment. The wireless power transmission system 1100 includes a wireless power feeder 1116 and a wireless power receiver 1118. The wireless power feeder 1116 includes, as basic components, a power transmission control circuit 1200, an exciting circuit 1110, a feeding coil circuit 1120, a phase detection circuit 1114, and a signal receiving circuit 1112. The wireless power receiver 1118 includes a receiving coil circuit 1130, a loading circuit 1140, a control signal generation circuit 1170, a reference signal generation circuit 1172, and a signal transmission circuit 1122.

A distance (hereinafter, referred to as "inter-coil distance") of about 0.2 m to 1.0 m is provided between a feeding coil L2 of the feeding coil circuit 1120 and a receiving coil L3 of the receiving coil circuit 1130. The wireless power transmission system 1100 mainly aims to feed power from the feeding coil L2 to receiving coil L3 by wireless. In the second embodiment, a description will be made assuming that resonance frequency fr is 100 kHz. The wireless power transmission system of the second embodiment may be made to operate in a high-frequency band like ISM (Industry-Science-Medical) frequency band. A low frequency band is advantageous over a high frequency band in reduction of cost of a switching transistor (to be described later) and reduction of switching loss. In addition, the low frequency band is less constrained by Radio Act.

The exciting circuit 1110 is a circuit in which an exciting coil L1 and a transformer T2 secondary coil Li are connected in series. The transformer T2 secondary coil Li constitutes a coupling transformer T2 together with a transformer T2 primary coil Lb and receives AC power from the power transmission control circuit 1200 by electromagnetic induction. The number of windings of the exciting coil L1 is 1, diameter of a conductive wire is 5 mm, and shape of the exciting coil L1 itself is a square of 210 mm×210 mm. In FIG. 1, the exciting coil L1 is represented by a circle for clarification. Other coils are also represented by circles for the same reason. All the coils illustrated in FIG. 1 are made of copper. Current I1 flowing in the exciting circuit 1110 is AC.

The feeding coil circuit 1120 is a circuit in which a feeding coil L2 and a capacitor C2 are connected in series. The exciting coil L1 and feeding coil L2 face each other. The distance between the exciting coil L1 and feeding coil L2 is as comparatively small as 10 mm or less. Thus, the exciting coil L1 and feeding coil L2 are electromagnetically strongly coupled to each other. The number of windings of the feeding coil L2 is 7, diameter of a conductive wire is 5 mm, and shape of the feeding coil L2 itself is a square of 280 mm×280 mm. When the AC current I1 is made to flow in the exciting coil L1, an electromotive force occurs in the feeding coil L2 according to the principle of electromagnetic induction to cause AC current I2 to flow in the feeding coil circuit 1120. The AC current I2 is considerably larger than the AC current I1. The values of the feeding coil L2 and capacitor C2 are set such that the resonance frequency fr of the feeding coil circuit 1120 is 100 kHz.

The receiving coil circuit 1130 is a circuit in which a receiving coil L3 and a capacitor C3 are connected in series. The feeding coil L2 and receiving coil L3 face each other. The number of windings of the receiving coil L3 is 7, diameter of a conductive wire is 5 mm, and shape of the receiving coil L3 itself is a square of 280 mm×280 mm. The values of the receiving coil L3 and capacitor C3 are set such that the resonance frequency fr of the receiving coil circuit 1130 is also 100 kHz. Thus, the feeding coil L2 and receiving coil L3 need not have the same shape. When the feeding coil L2 generates a magnetic field at the resonance frequency fr=100 kHz, the feeding coil L2 and receiving coil L3 magnetically resonate, causing large current I3 to flow in the receiving coil circuit 1130.

The loading circuit 1140 is a circuit in which a loading coil L4 is connected to a load LD through a rectification circuit 1124 and a measurement circuit 1126. The receiving coil L3 and loading coil L4 face each other. The distance between the receiving coil L3 and loading coil L4 is as comparatively small as about 10 mm or less. Thus, the receiving coil L3 and loading coil L4 are electromagnetically strongly coupled to each other. The number of windings of the loading coil L4 is 1, diameter of the wire of the loading coil L4 is 5 mm, and shape of the loading coil L4 itself is a square of 300 mm×300 mm. When the current I3 is made to flow in the receiving coil L3, an electromotive force occurs in the loading circuit 1140 to cause AC current I4 to flow in the loading circuit 1140. The AC current I4 is rectified into DC current by the rectification circuit 1124. Although part of the DC current flows in the measurement circuit 1126, most of the DC current flows in the load LD as DC current I5. The rectification circuit 1124 is a general circuit constituted by a bridge circuit 1128 and a capacitor C5. The details of the measurement circuit 1126 will be described later.

The AC power fed from the feeding coil L2 of the wireless power feeder 1116 is received by the receiving coil L3 of the wireless power receiver 1118 and then extracted from the load LD as DC power. Voltage applied to the load LD is referred to as "load voltage V5".

If the load LD is connected in series to the receiving coil circuit 1130, the Q-value of the receiving coil circuit 1130 is degraded. Therefore, the receiving coil circuit 1130 for power reception and loading circuit 1140 for power extraction are separated from each other. In order to enhance the power transmission efficiency, the center lines of the feeding coil L2, receiving coil L3, and loading coil L4 are preferably made to coincide with one another.

The measurement circuit 1126 includes resistors R1 and R2, a control power supply Vs, and a comparator 1132. The load voltage V5 is divided by the resistors R1 and R2. Voltage applied to both ends of the resistors R2 is referred to as "output voltage". The potential at a connecting point F between the resistors R1 and R2 is input to the negative terminal of the comparator 1132 as "measurement potential". A control power supply Vs is connected to the positive terminal of the comparator 1132. Input voltage at the positive terminal of the comparator 1132 generated by the control power supply Vs is referred to as "reference potential".

The comparator 1132 amplifies a difference (hereinafter, referred to as "correction voltage") between the measurement potential and reference potential and outputs the amplified value as a T0 signal. The T0 signal is a DC voltage signal and indicates the magnitude of the correction voltage. In other words, the T0 signal is a signal indicating a change in the load voltage V5. Although the details will be described later, in the wireless power transmission system 1100 of the second embodiment, the feeding power is controlled so as to make the correction voltage be zero to thereby stabilize the output voltage (load voltage V5). In the second embodiment, the reference potential is set to 2.5 (V). Further, the resistors R1 and R2 are set such that the measurement potential is 2.5 (V) and correction voltage is 0 (V) when the load voltage V5 is 24 (V). The control voltage Vs is a variable DC voltage supply and can arbitrarily be adjusted.

The control signal generation circuit 1170 is a circuit that generates an AC voltage signal of a control frequency fc as a T1 signal. The control frequency fc in the second embodiment is 1.0 kHz. The details of the control signal generation circuit 1170 will be described later using FIG. 19. The comparator 1174 compares the T0 signal and T1 signal and generates a high-level T2 signal (enable signal: AC voltage signal) when the level of the T1 signal is higher than that of the T0 signal (T1>T0). Although details will be described later, the duty ratio of the T2 signal changes depending on the correction voltage. A relationship among the T0 to T2 signals will be described later using FIG. 20. The reference signal generation circuit 1172 generates an AC voltage signal of a reference frequency fs as a T3 signal. The reference frequency fs in the second embodiment is 38 kHz. The signal transmission circuit 1122 generates a T4 signal as an AC light signal based on the T2 and T3 signals. The T4 signal is an "output signal" indicating the magnitude of the output on the power receiving side and is received by the signal receiving circuit 1112 of the wireless power feeder 1116. Based on the T4 signal, the power feeding side can recognize the magnitude of the correction voltage, in other words, a variation of the load voltage V5. Circuit configurations and processing of the signal transmission circuit 1122 and reference signal generation circuit 1172 will be described later using FIGS. 21 and 22.

A configuration of the power transmission control circuit 1200 will be described. A VCO (Voltage Controlled Oscillator) 1202 is connected to the primary side of the gate-drive transformer T1. The VCO 1202 functions as an "oscillator" that generates AC voltage Vo at the drive frequency fo. Although the waveform of the AC voltage Vo may be a sine wave, it is assumed here that the voltage waveform is a rectangular wave (digital wave). The AC voltage Vo causes current to flow in a transformer T1 primary coil Lh alternately in both positive and negative directions. A transformer T1 primary coil Lh, a transformer T1 secondary coil Lf, and a transformer T1 secondary coil Lg constitute a gate-drive coupling transformer T1. Electromagnetic induction causes current to flow also in the transformer T1 secondary coil Lf and transformer T1 secondary coil Lg alternately in both positive and negative directions.

As the VCO 1202 in the second embodiment, a built-in unit (product serial number MC14046B) manufactured by Motorola, Inc is used. The VCO 1202 also has a function of dynamically changing the drive frequency fo based on phase difference indicating voltage SC fed from the phase detection circuit 1150 (described later in detail).

The following description will be made assuming that the minimum value fo1 of the drive frequency fo is 90 kHz, and the maximum value fo2 thereof is 99 kHz. The appropriate range of the phase difference indicating voltage SC is 1.0 (V) to 4.0 (V). The phase difference indicating voltage SC and drive frequency fo are directly proportional to each other. That is, when the phase difference indicating voltage SC is 1.0 (V), the drive frequency fo (=fo1) is 90 kHz, and when the phase difference indicating voltage SC is 4.0 (V), the drive frequency fo (=fo2) is 99 kHz.

Capacitors CA and CB charged by a DC power supply Vdd each serve as a power supply for the power transmission control circuit 1200. The capacitor CA is provided between points C and E of FIG. 14, and capacitor CB is provided between points E and D. Assuming that the voltage (voltage between points C and $\overline{E}$) of the capacitor CA is VA, voltage (voltage between points E and D) of the capacitor CB is VB, VA+VB (voltage between points C and D) represents input voltage. That is, the capacitors CA and CB each function as a DC voltage supply.

One end of the transformer T1 secondary coil Lf is connected to the gate of a switching transistor Q1, and the other end of the transformer T1 secondary coil Lf is connected to the source of a switching transistor Q1. One end of the transformer T1 secondary coil Lg is connected to the gate of a switching transistor Q2, and the other end of the transformer T1 secondary coil Lg is connected to the source of a switching transistor Q2. When VCO 1202 generates AC voltage Vo at drive frequency fo, voltage Vx (Vx>0) is alternately applied, at drive frequency fo, to the gates of the switching transistors Q1 and Q2. As a result, the switching transistors Q1 and Q2 are alternately turned on/off at the drive frequency fo. The switching transistors Q1 and Q2 are enhancement type MOSFET (Metal Oxide Semiconductor Field effect transistor) having the same characteristics but may be other transistors such as a bipolar transistor. Further, other switches such as a relay switch may be used in place of the transistor.

The drain of the switching transistor Q1 is connected to the positive electrode of the capacitor CA. The negative electrode of the capacitor CA is connected to the source of the switching transistor Q1 through the transformer T2 primary coil Lb. The source of the switching transistor Q2 is connected to the negative electrode of the capacitor CB. The positive electrode of the capacitor CB is connected to the drain of the switching transistor Q2 through the transformer T2 primary coil Lb.

Voltage between the source and drain of the switching transistor Q1 is referred to as source-drain voltage VDS1, and voltage between the source and drain of the switching transistor Q2 is referred to as source-drain voltage VDS2. Current flowing between the source and drain of the switching transistor Q1 is referred to as source-drain current IDS1, and current flowing between the source and drain of the switching transistor Q2 is referred to as source-drain current IDS2. The directions of arrows in the diagram indicate the positive directions, and directions opposite to the directions of the arrows indicate the negative directions.

When the switching transistor Q1 is turned conductive (ON), the switching transistor Q2 is turned non-conductive (OFF). A main current path (hereinafter, referred to as "first current path") at this time extends from the positive electrode of the capacitor CA, passes through the point C, switching transistor Q1, transformer T2 primary coil Lb, and point E in this order, and returns to the negative electrode of the capacitor CA. The switching transistor Q1 functions as a switch for controlling conduction/non-conduction of the first current path.

When the switching transistor Q2 is turned conductive (ON), the switching transistor Q1 is turned non-conductive (OFF). A main current path (hereinafter, referred to as "second current path") at this time extends from the positive electrode of the capacitor CB, passes through the point E, transformer T2 primary coil Lb, switching transistor Q2, and point D in this order, and returns to the negative electrode of the capacitor CB. The switching transistor Q2 functions as a switch for controlling conduction/non-conduction of the second current path.

Current flowing in the transformer T2 primary coil Lb in the power transmission control circuit 1200 is referred to as "current IS". The current IS is AC current, and the current flow in a first current path is defined as the positive direction and current flow in a second current path is defined as the negative direction.

When the VCO 1202 feeds the AC voltage Vo at the drive frequency fo, the first and second current paths are switched at the drive frequency fo. Since the AC current Is of the drive frequency fo flows in the transformer T2 primary coil Lb, the AC current I1 flows in the exciting circuit 1110 at the drive frequency fo, and the AC current I2 of the drive frequency fo flows in the feeding circuit 1120. The closer the value of the drive frequency fo is to the resonance frequency fr, the higher the power transmission efficiency becomes. When the drive frequency fo is equal to the resonance frequency fr, the feeding coil L2 of the feeding coil circuit 1120 and capacitor C2 are in a resonance state. The receiving coil circuit 1130 is also a resonance circuit of the resonance frequency fr, so that the feeding coil L2 and receiving coil L3 magnetically resonate. At this time, the maximum transmission efficiency can be obtained.

In the case of the second embodiment, however, the resonance frequency fr is not included in the operating range of the drive frequency fo, so that the power transmission efficiency does not reach the maximum value. This is because priority is given to the stability of the load voltage V5 over the maximization of the power transmission efficiency. A change in the load voltage V5 can be detected from the correction voltage, so that the wireless power feeder 116 automatically adjusts the drive frequency fo so as to make the correction voltage be zero. The details will be described later.

The resonance frequency fr slightly changes depending on use condition or use environment of the feeding coil circuit 1120 or receiving coil circuit 1130. Further, in the case where the feeding coil circuit 1120 or receiving coil circuit 1130 is replaced with new one, the resonance frequency fr changes. Alternatively, there may be case where the resonance frequency needs to be changed aggressively by setting the electrostatic capacitance of the capacitor C2 or capacitor C3 variable. Further, according to the experiment made by the present inventor, it has been found that the resonance frequency starts falling when the distance between the feeding coil L2 and receiving coil L3 is made smaller to some extent. When the difference between the resonance frequency fr and drive frequency fo changes, the power transmission efficiency changes. When the power transmission efficiency changes, the load voltage V5 also changes. Therefore, in order to stabilize the load voltage V5, it is necessary to keep the difference between the resonance frequency fr and the drive frequency fo constant even if the resonance frequency fr changes.

A detection coil LSS is provided at the feeding coil circuit 1120. The detection coil LSS is a coil wounded around a core 1154 (toroidal core) having a penetration hole NS times. The core 1154 is formed of a known material such as ferrite, silicon steel, or permalloy. The number of windings NS of the detection coil LSS in the present embodiment is 100.

A part of the current path of the feeding coil circuit 1120 penetrates the penetration hole of the core 1154. This means that the number of windings NP of the feeding coil circuit 1120 with respect to the core 1154 is one. With the above configuration, the detection coil LSS and feeding coil L2 constitute a coupling transformer. An AC magnetic field generated by the AC current I2 of the feeding coil L2 causes inductive current ISS having the same phase as that of the current I2 to flow in the detection coil LSS. The magnitude of the inductive current ISS is represented by I2·(NP/NS) according to the law of equal ampere-turn.

A resistor R4 is connected to both ends of the detection coil LSS. One end B of the resistor R4 is grounded, and the other end A thereof is connected to the phase detection circuit 1114 through a comparator 1142.

Potential VSS is digitized by the comparator 1142 to be an S2 signal. The comparator 1142 outputs a saturated voltage of 3.0 (V) when the potential VSS exceeds a predetermined threshold, e.g., 0.1 (V). Thus, the potential VSS is converted into the S0 signal of a digital waveform by the comparator 1142. The current I2 and inductive current ISS have the same phase, and inductive current ISS and potential VSS (S0 signal) have the same phase. Further, the AC current Is flowing in the power transmission control circuit 1200 have the same phase as that of the current I2. Therefore, by observing the waveform of the S2 signal, the current phase of the AC current Is can be measured.

When the resonance frequency fr and drive frequency fo coincide with each other, the current phase and voltage phase also coincide with each other. A deviation between the resonance frequency fr and drive frequency fo can be measured from the phase difference between the current phase and voltage phase. The wireless power transmission system 1100 in the present embodiment measures the deviation between the resonance frequency fr and drive frequency fo based on the phase difference to thereby make the drive frequency fo automatically track a change of the resonance frequency fr.

The phase detection circuit 1114 includes a current phase detection circuit 1144, a phase comparison circuit 1150, and a low-pass filter 1152. The low-pass filter 1152 is a known circuit and inserted so as to cut a high-frequency component of the phase difference indicating voltage SC. As the phase comparison circuit 1150 in the second embodiment, a built-in unit (Phase Comparator) (product serial number MC14046B) manufactured by Motorola is used, as in the case of the VCO 1202. Thus, the phase comparison circuit 1150 and VCO 1202 can be implemented in one chip.

The current phase detection circuit 1144 generates an S1 signal as a signal indicating a current phase. The S1 signal is input to the phase comparison circuit 1150. The AC voltage Vo generated by the VCO 1202 is input to the phase comparison circuit 1150 as an S2 signal indicating a voltage phase. The phase comparison circuit 1150 detects a deviation (phase difference) between the current phase and voltage phase from the S1 and S2 signals and generates the phase difference indicating voltage SC indicating the magnitude of the phase difference. Detecting the phase difference allows detection of the magnitude of the deviation between the resonance frequency fr and drive frequency fo. It is possible to keep the phase difference between the drive frequency fo and the resonance frequency fr constant by controlling the drive frequency fo according to the phase difference indicating voltage SC.

For example, when the drive frequency fo and resonance frequency fr deviate from each other, the phase difference is accordingly increased, so that the phase comparison circuit 1150 generates the phase difference indicating voltage SC so as to reduce the phase difference. Thus, even if the resonance frequency fr changes, it is possible to keep the power transmission efficiency constant to thereby stabilize the load voltage V5. A circuit configuration of the current phase detection circuit 1144 and the signal receiving circuit 1112 will be described later using FIG. 23, and relationship between the S1 and S2 signals will be described later using FIG. 24.

The S2 signal may be obtained by connecting resistors to both ends of the transformer T1 primary coil Lh in parallel to divide the AC voltage Vo. Even in the case where the AC voltage Vo generated by the VCO 1202 is large, the AC voltage can be reduced to a manageable level by the voltage division. The voltage phase may be measured from the source-drain voltages VDS1 and VDS2 or source-gate voltages VGS1 and VGS2.

Even though the resonance frequency fr is constant, the load voltage V5 may be changed in some cases. For example, in the case where the load LD is a variable resistor or in the case where the load LD is replaced with new one, the load voltage V5 changes. In the first embodiment, a change in the load voltage V5 is detected as the correction voltage, and the drive frequency fo is automatically adjusted so as to make the correction voltage be zero, whereby the load voltage V5 is stabilized.

The correction voltage is transmitted from the signal transmission circuit 1122 to signal receiving circuit 1112 as the T4 signal (AC light signal). The signal receiving circuit 1112 converts the T4 signal as the AC light signal into T5 signal as the DC voltage signal. The voltage level of the T5 signal is directly proportional to the load voltage V5.

The current phase detection circuit 1144 adjusts an S0 signal (AC voltage signal) indicating a current phase by using the T5 signal (DC voltage signal) indicating the correction voltage and outputs the S1 signal (AC voltage signal) as a correction current phase. When the load voltage V5 assumes a desired value 24 (V), the S0 signal directly becomes the S1 signal. The phase comparison circuit 1150 detects the phase difference between the voltage phase and current phase of the AC power based on the S1 and S2 signals and outputs the phase difference indicating voltage SC. The VCO 1202 adjusts the drive frequency fo based on the phase difference indicating voltage SC. More specifically, the VCO 1202 changes the pulse width of the AC voltage Vo to thereby change the drive frequency fo.

Also, when the correction voltage is not zero, that is, when S1 signal is adjusted by T5 signal, the phase comparison circuit 1150 detects the phase difference between the voltage phase and current phase of the AC power based on the S1 and S2 signals and outputs the phase difference indicating voltage SC. However, the S1 signal at this time is a signal obtained by correcting the S0 signal in accordance with the T5 signal, so that the S1 signal does not indicate the actual current phase. The adjustment logic based on the correction voltage will be described later using FIG. 25.

Figure 15:
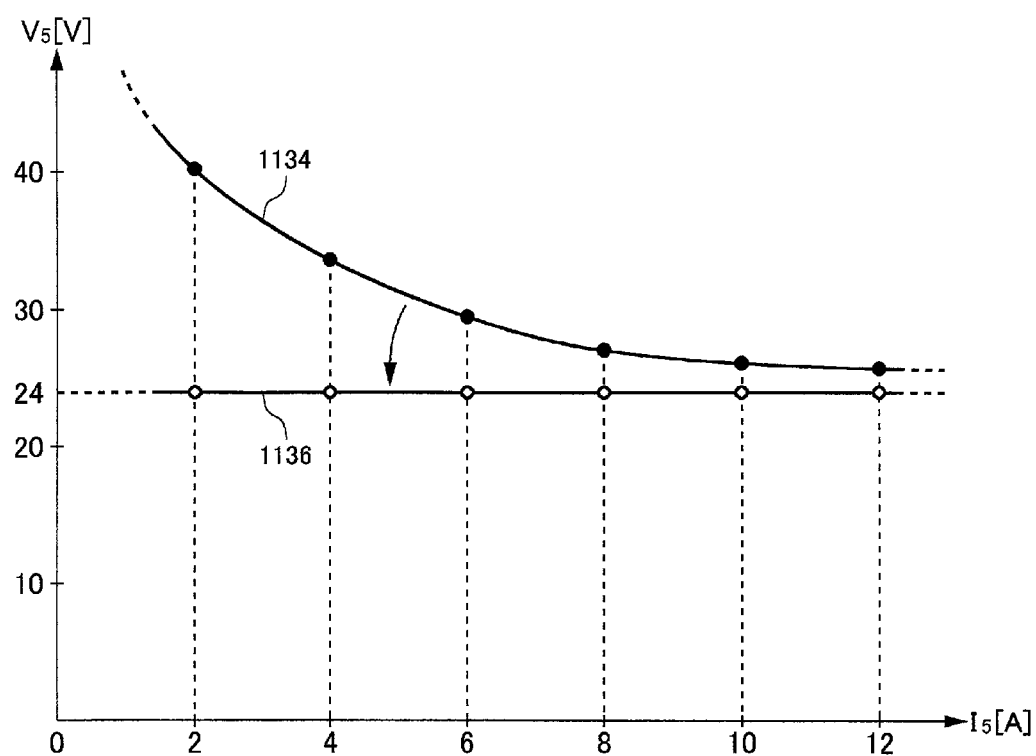
FIG. 15 is a graph illustrating a relationship between load current and load voltage.

FIG. 15 is a graph illustrating a relationship between load current I5 and load voltage V5. The horizontal axis represents the magnitude of the load current I5 (DC) flowing in the load LD, and the vertical axis represents the load voltage V5. A non-adjustment characteristic 1134 represents a current-voltage characteristic obtained in the case where adjustment based on the correction voltage is not performed. In the case of the non-adjustment characteristic 1134, when the load LD increases, the load current I5 decreases while the load voltage V5 increases. On the other hand, when the load LD decreases, the load current I5 increases while the load voltage V5 decreases. As described above, when the load LD changes, the load voltage V5 changes even when constant power is fed.

The wireless power transmission system 1100 in the second embodiment achieves the current-voltage characteristic represented by an adjustment characteristic 1136. To be specific, the S1 signal is adjusted based on the correction voltage to change the power transmission efficiency, whereby the load voltage V5 is stabilized.

Figure 16:
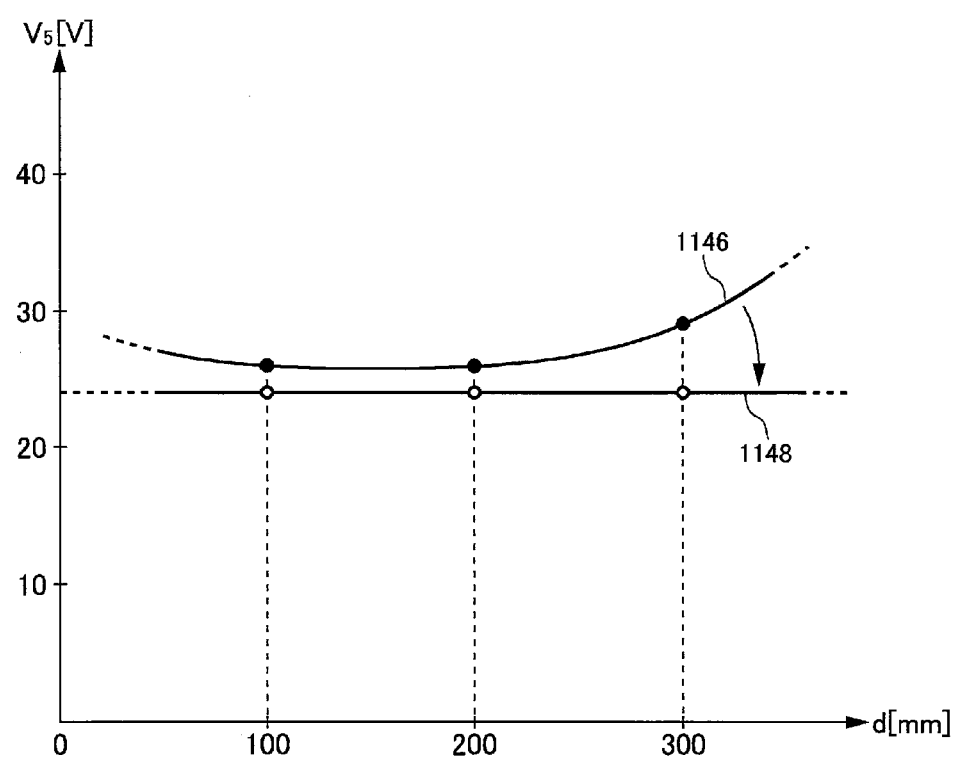
FIG. 16 is a graph illustrating inter-coil distance and load voltage.

FIG. 16 is a graph illustrating a relationship between inter-coil distance d and load voltage V5. The horizontal axis represents the inter-coil distance d between the feeding coil L2 and receiving coli L3, and the vertical axis represents the load voltage V5. A non-adjustment characteristic 1146 represents a voltage-distance characteristic obtained in the case where adjustment based on the correction voltage is not performed. As describe above, the resonance frequency fr changes depending on the inter-coil distance d. When the resonance frequency fr changes to cause the difference between the drive frequency fo and resonance frequency fr to change, the power transmission efficiency changes. Even when the drive frequency fo is made to track the resonance frequency fr, the load voltage V5 changes to a certain degree depending on the inter-coil distance d.

The wireless power transmission system 1100 in the second embodiment achieves the voltage-distance characteristic represented by an adjustment characteristic 1148. That is, the S1 signal is adjusted based on the correction voltage to change the power transmission efficiency, whereby the load voltage V5 is stabilized.

Figure 17:
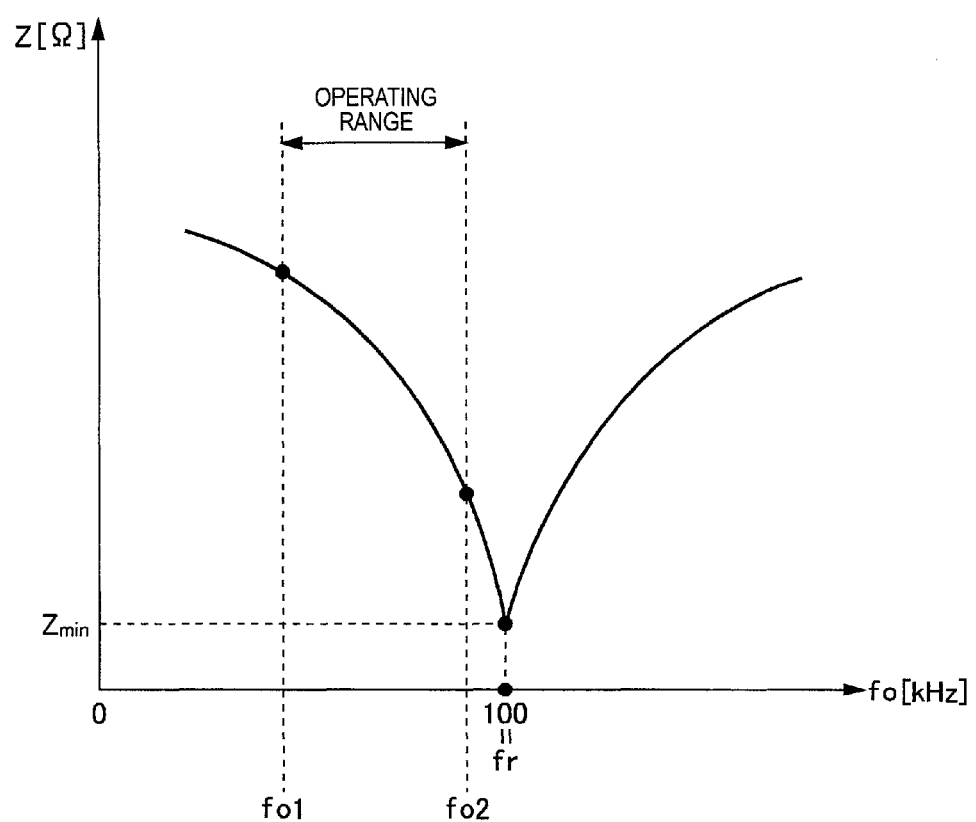
FIG. 17 is a graph illustrating a relationship between the impedance of a feeding coil circuit and drive frequency.

FIG. 17 is a graph illustrating a relationship between the impedance Z of the feeding coil circuit 1120 and drive frequency fo. The vertical axis represents the impedance Z of the feeding coil circuit 1120 (a circuit in which the capacitor C2 and the feeding coil L2 are connected in series). The horizontal axis represents the drive frequency fo. The impedance Z is a minimum value Zmin at the resonance state. Although Zmin=0 at the resonance state is ideal, Zmin does not become zero in general since some resistance components are included in the feeding coil circuit 1120.

When the drive frequency fo and resonance frequency fr coincide with each other, the impedance Z becomes minimum and the capacitor C2 and the feeding coil L2 are in a resonance state. When the drive frequency fo and resonance frequency fr deviate from each other, one of the capacitive reactance and inductive reactance prevails the other, so that the impedance Z is also increased.

The impedance Z increases as the deviation from the drive frequency fo and resonance frequency fr advances, with the result that the power transmission efficiency is degraded. That is, it is possible to change the power transmission efficiency by changing the difference between the drive frequency fo and resonance frequency fr.

Figure 18:
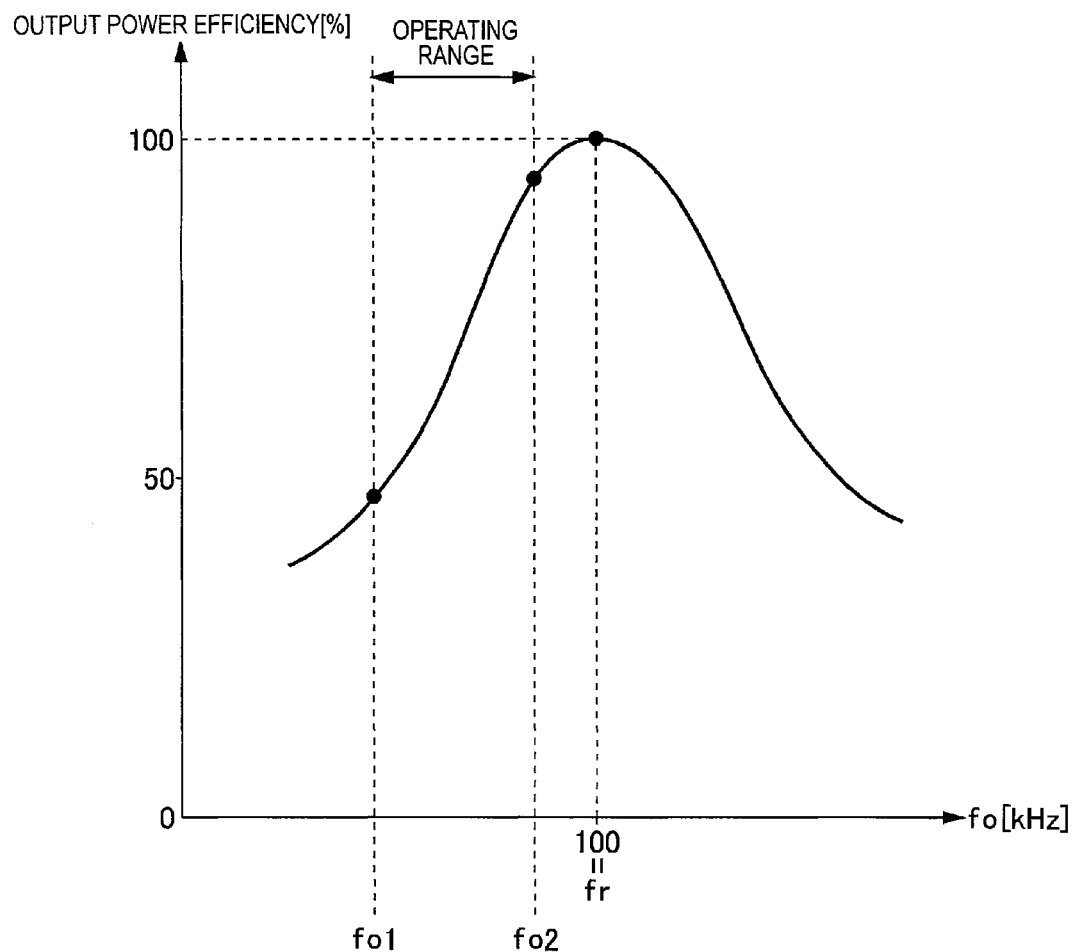
FIG. 18 is a graph illustrating a relationship between output power efficiency and drive frequency.

FIG. 18 is a graph illustrating a relationship between the output power efficiency and drive frequency fo. The output power efficiency is a ratio of power actually fed from the feeding coil L2 relative to the maximum output value. When the drive frequency fo coincides with the resonance frequency fr, a difference between the current phase and voltage phase becomes zero and therefore the power transmission efficiency becomes maximum, with the result that output power efficiency of 100(%) can be obtained. In the wireless power transmission system 1100 of the second embodiment, the drive frequency fo is adjusted in a range of fo1 to fo2 which is lower than the resonance frequency fr.

Figure 19:
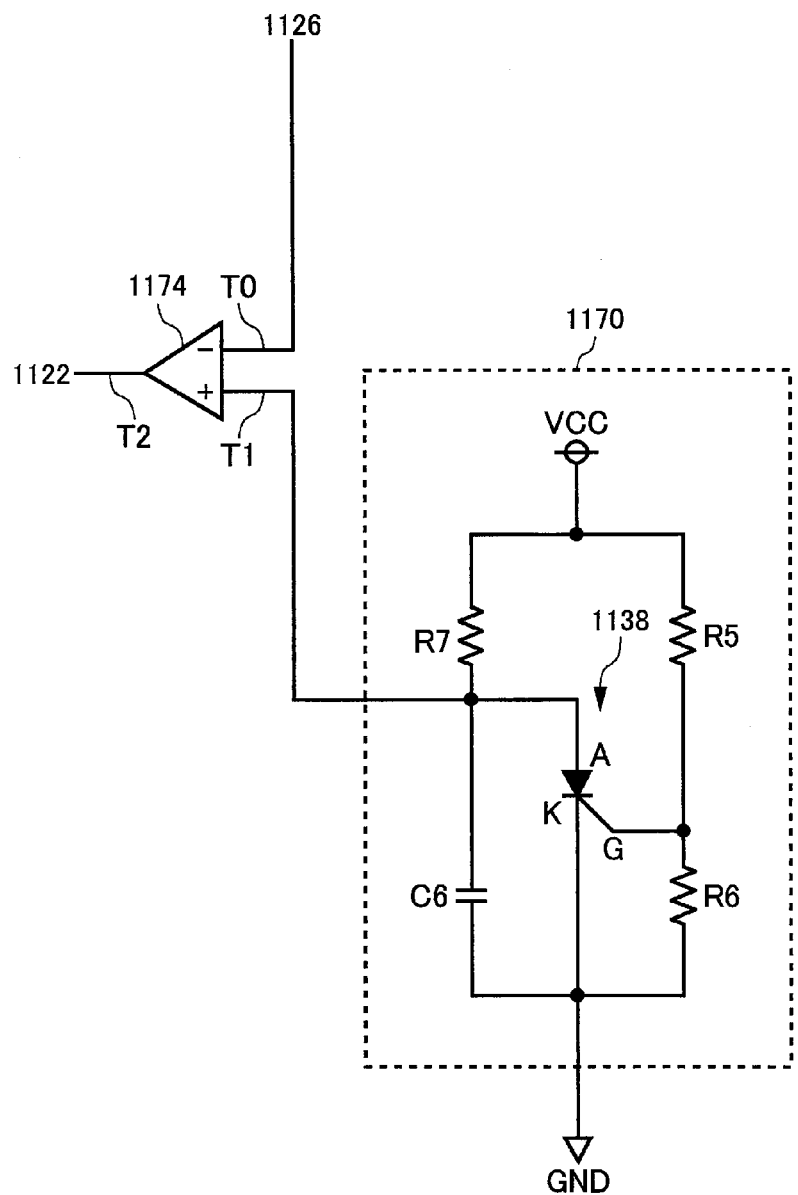
FIG. 19 is a circuit diagram of a control signal generation circuit in the second embodiment.

FIG. 19 is a circuit diagram of the control signal generation circuit 1170. The T1 signal (control signal) output from the control signal generation circuit 1170 is input to the positive terminal of the comparator 1174. The T0 signal output from the measurement circuit 1126 is input to the negative terminal of the comparator 1174. The T0 signal is a DC voltage signal indicating the correction voltage.

The control signal generation circuit 1170 generates, as the T1 signal, AC voltage of a saw-tooth waveform at the control frequency of 1.0 kHz. The control signal generation circuit 1170 includes resistors R5 to R7, a capacitor C6, and a thyristor 1138. Gate voltage VG obtained by dividing power supply voltage of a power supply VCC by the resistors R5 and R6 is applied to the gate G of the thyristor 1138. The gate voltage VG is a fixed value. The anode A of the thyristor 1138 is connected to the power supply VCC and the ground through the resistor R7 and capacitor C6, respectively. The power supply voltage is reduced across the resistor R7 and thereby anode potential VA is applied to the thyristor 1138. The T1 signal represents this anode potential VA.

When the anode potential VA is not higher than the gate voltage VG, electric conduction is not provided between the anode and cathode of the thyristor 1138, and the capacitor C6 is charged during this period. After completion of the charging of the capacitor C6, the anode potential VA (T1 signal) is increased and, when the anode potential VA becomes higher than the gate potential VG, electric conduction is provided between the anode and cathode of the thyristor 1138. At this time, the electrical charge of the capacitor C6 is discharged through the thyristor 1138, with the result the anode potential VA becomes not higher than gate voltage VG once again. The control signal generation circuit 1170 repeats the above process at 1.0 kHz (control frequency fc). As a result, the T1 signal of a saw-tooth waveform is generated as described later in FIG. 20. The control frequency fc is determined by the time constants of the capacitor C6 and resistor R7.

The comparator 1174 outputs a high-level T2 signal (enable signal) when the level of the T1 signal is higher than that of the T0 signal while it outputs a low-level T2 signal in the rest of the time. That is, the period during which the level of the T1 signal is higher than that of the T0 signal is the enable period, and the rest of the time period is the disable period. The higher the correction potential, the higher the level of the T0 signal, and the shorter the enable period.

Figure 20:
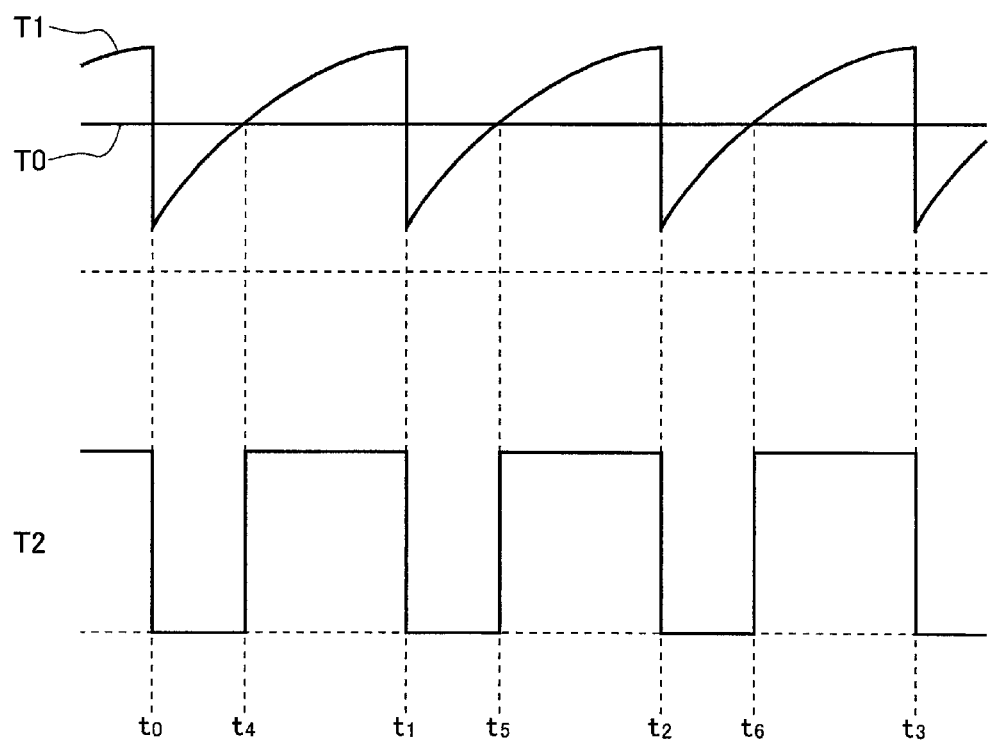
FIG. 20 is a time chart illustrating a relationship among T0 to T2 signals.

FIG. 20 is a time chart illustrating a relationship among the T0 to T2 signals. In the control signal generation circuit 1170, charging of the capacitor C6 is started at time t0. The anode potential VA is gradually increased and, accordingly, the level of the T1 signal is gradually increased. At time t1, the anode potential VA becomes higher than the gate potential VG, and electric conduction is provided between the anode and cathode of the thyristor 1138. Since the capacitor C6 discharges its electrical charge, the anode potential VA (S1 signal) is abruptly reduced. The time period from time t0 to time t1 is referred to as "unit period". The same is applied to the time period after the time t1. Since the control frequency fc is 1.0 kHz, the length of each of the unit period is 1.0 (msec).

The T0 signal is a DC voltage signal whose voltage level changes depending on the correction voltage. The comparator 1174 compares the T0 signal and T1 signal and generates a high-level T2 signal when the level of the T1 signal is higher than that of the T0 signal while it outputs a low-level T2 signal in the rest of the time. Among the unit period from t0 to t1, the T2 signal assumes a low level from time t0 to t4 and assumes a high level from time t4 to t1. That is, among the unit period from time t0 to t1, the time period from time t0 to t4 is the disable period, and time period from time t4 to time t1 is enable period. The level of the T0 signal is changed by the correction voltage, causing the duty ratio between the enable period and disable period to change. When the load voltage V5 increases, the correction potential decreases, with the result that the duty ratio of the T2 signal increases. Conversely, when the load voltage V5 decreases, the correction potential increases, with the result that the duty ratio of the T2 signal decreases. In the present embodiment, a setting has been made such that the duty ratio does not reach 100% even if the correction potential becomes zero.

Figure 21:
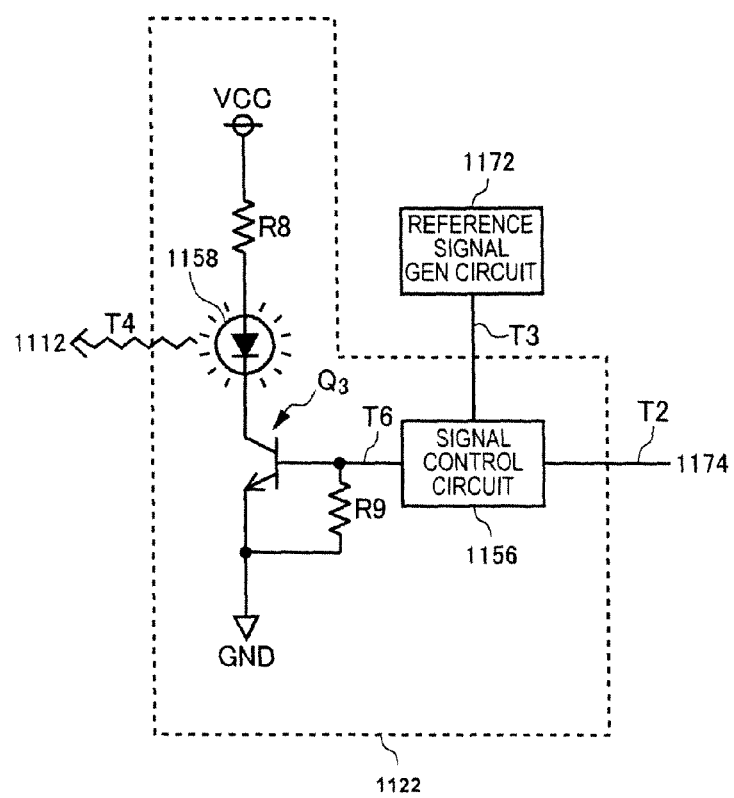
FIG. 21 is a circuit diagram of a signal transmission circuit in the second embodiment.

FIG. 21 is a circuit diagram of the signal transmission circuit 1122 in the second embodiment. The signal transmission circuit 1122 includes an infrared ray LED (Light Emitting Diode) 1158, a transistor Q3, and a signal control circuit 1156. The transistor Q3 is an emitter-grounded bipolar transistor, and the base and emitter thereof are connected through a resistor R9. One end of the infrared ray LED 1158 is connected to the power supply VCC through the resistor R8, and the other end thereof is connected to the collector of the transistor Q3. The signal control circuit 1156 is also connected to the base of the transistor Q3.

As the signal control circuit 1156, which is a known circuit, an IC (Integrated Circuit) having product serial number UCC37321 manufactured by Texas Instruments Inc. can be used. The reference signal generation circuit 1172 and comparator 1174 are connected to the signal control circuit 1156. The signal control circuit 1156 receives the T2 and T3 signals and outputs a T6 signal. The reference signal generation circuit 1172 is an oscillator for generating the T3 signal (reference signal) at a predetermined reference frequency fs. In the second embodiment, the reference frequency fs is assumed to be set to 38 kHz which is sufficiently higher than the control frequency fc. Although the waveform of the T3 signal may be a sine wave, it is assumed here that the waveform of the T3 signal is a rectangular wave (digital waveform).

The signal control circuit 1156 outputs the T3 signal (reference signal) as T6 signal only during the enable period, that is, during the enable period. During the disable period, the T6 signal is fixed to a low level.

The T6 signal (AC voltage signal) is changed into a T4 signal (AC light signal) by the infrared ray LED 1158. The infrared ray LED 1158 transmits the T4 signal (AC light signal) to the signal receiving circuit 1112. The T4 signal in the second embodiment is an infrared ray signal. The general wavelength of an infrared ray is about 940 nm. The T4 signal travels up to several meters, so that there occurs no problem even if the inter-coil distance is large. Further, the infrared ray is hardly subject to the magnetic field generated by the feeding coil L2 or receiving coil L3, an advantage that the T4 signal and feeding power hardly interact with each other can be obtained.

Figure 22:
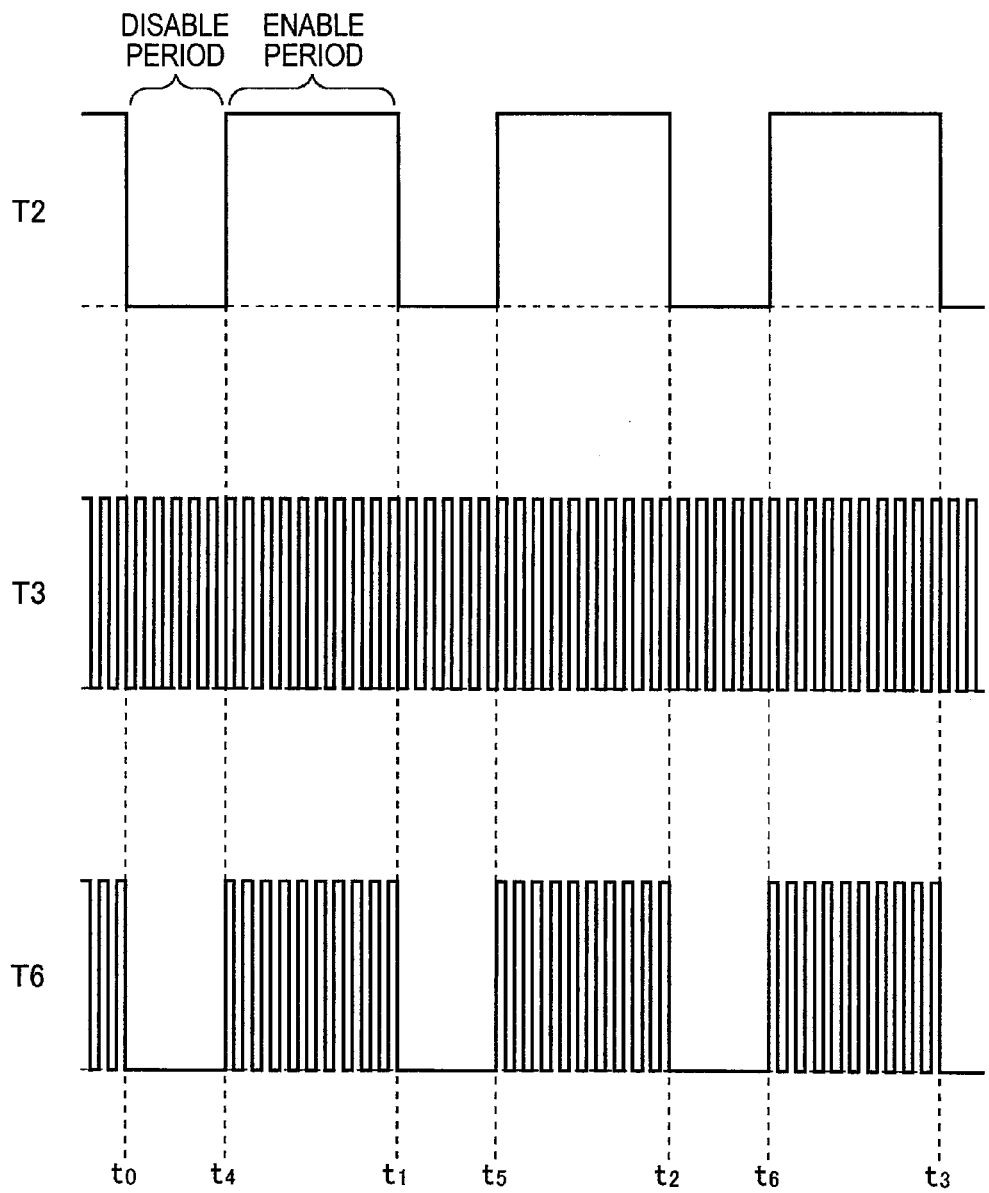
FIG. 22 is a time chart illustrating a relationship among T2, T3, and T6 signals.

FIG. 22 is a time chart illustrating a relationship among the T2, T3, and T6 signals. As described using FIG. 20, the T2 signal (enable signal) is an AC voltage signal having a control frequency fc of 1.0 kHz in which each of the time periods from t0 to t1, t1 to t2, . . . , is set as the unit period. The time period during which the T2 signal assumes a high level is the enable period, and time period during which the T2 signal assumes a low level is the disable period. The T3 signal is an AC voltage signal having a reference frequency fs of 38 kHz. The signal control circuit 1156 outputs the T3 signal as the T6 signal only during the enable signal. That is, the logical AND between the T2 and T3 signals corresponds to the T6 signal.

The T6 signal which is an AC voltage signal is converted into the T4 signal which is the AC light signal and emitted toward the signal receiving circuit 1112. The infrared ray LED 1158 blinks at the reference frequency fs of 38 kHz during the enable period and turns off in the disable period. The blinking period and turn-off period are repeated at the control frequency fc. The duty ratio between the blinking period and turn-off period changes depending on the correction voltage. The higher the correction voltage is, the shorter the blinking period. The ratio of the blinking period relative to the entire unit period is referred to as "duty ratio of T4 signal (output signal)".

The T2 signal may be used in place of the T6 signal to turn on the infrared ray LED 1158. In this case, the infrared ray LED 1158 continues to light during the enable period. The adoption of the configuration of the second embodiment in which the infrared ray LED 1158 is made to blink according to the T3 signal during the enable time effectively reduces the power consumption of the infrared ray LED 1158.

Figure 23:
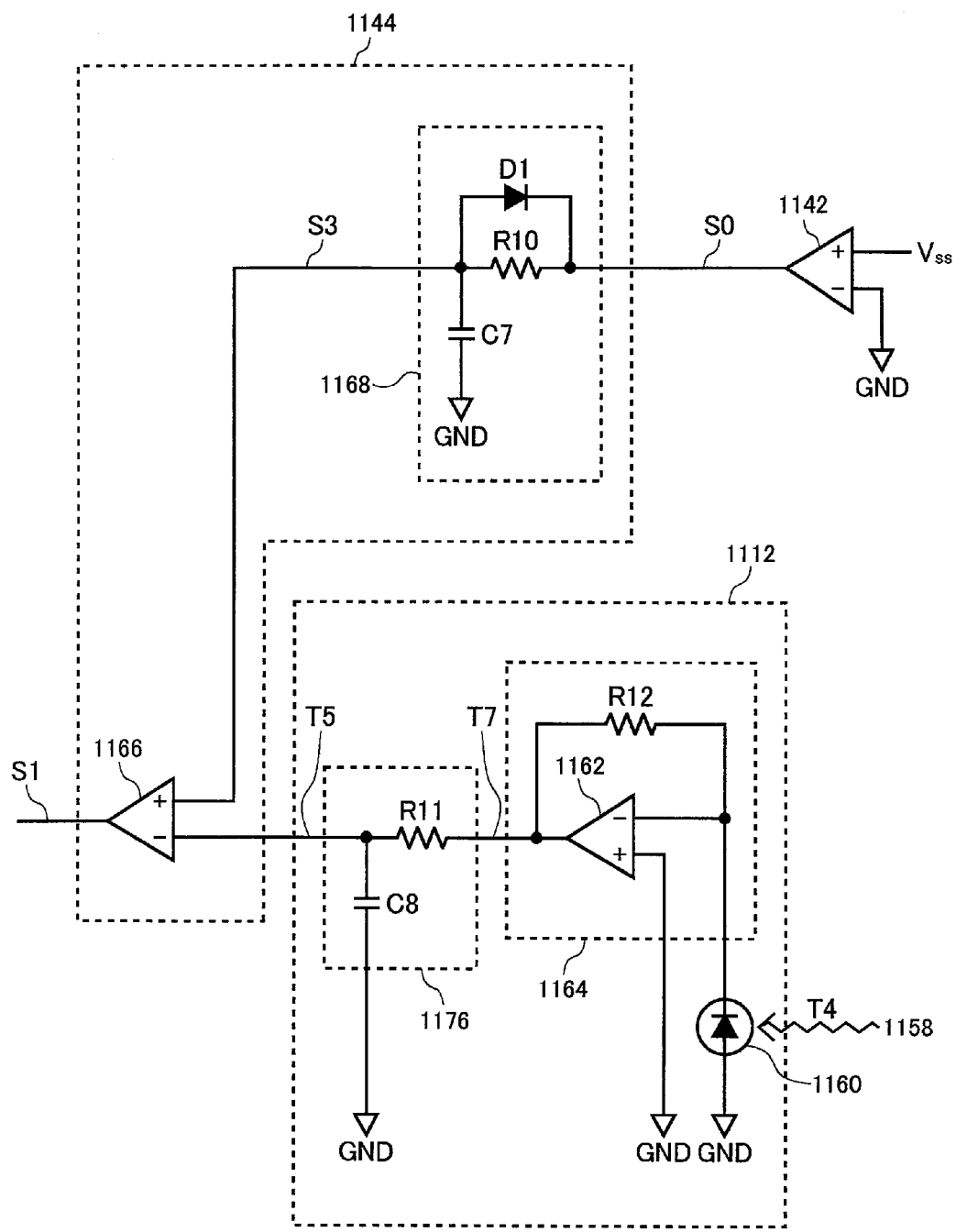
FIG. 23 is a circuit diagram illustrating a current phase detection circuit and a signal receiving circuit in the second embodiment.

FIG. 23 is a circuit diagram of the current phase detection circuit 1144 and signal receiving circuit 1112 in the second embodiment. The current phase detection circuit 1144 includes a comparator 1166 and a current waveform shaping circuit 1168. The potential VSS is shaped into the S0 signal of a digital waveform by the comparator 142 and input to the current waveform shaping circuit 1168. The current waveform shaping circuit 1168 shapes the S0 signal of a digital waveform (rectangular waveform) into an S3 signal of a sawtooth waveform. In the current waveform shaping circuit 1168, a resistor R10 is inserted in the path of the S0 signal, and a diode D1 is connected in parallel to the resistor R10. The transmission path of the S0 signal is grounded through a capacitor C7. The S3 signal (AC voltage signal) is input to the positive terminal of the comparator 1166. The S3 signal is a signal indicating the current phase.

The signal receiving circuit 1112 includes a photodiode 1160, a voltage conversion section 1164, and a low-pass filter 1176. The voltage conversion section 1164 includes a comparator 1162 and a resistor R12.

The photodiode 1160 receives the intermittently blinking T4 signal. The T4 signal (AC light signal) is converted into a T7 signal (AC voltage signal) by the voltage conversion section 1164. In the voltage conversion section 1164, the resistor R12 is adjusted in the way output 1 (mV) per 1 lux. The brightness of the T4 signal at the reception time is about 0 to 2000 (lux) and, accordingly, the voltage level of the T7 signal is 0 to 2.0 (V). The duty ratio of the T7 signal indicates the correction voltage. The T7 signal (AC voltage signal) is converted into the T5 signal (DC voltage signal) having a fixed value by the low-pass filter 1176. The low-pass filter 1176 is a general circuit including a resistor R11 and a capacitor C8. The higher the correction voltage, the lower the voltage level of the T5 signal is set. The T5 signal (DC voltage signal) is input to the negative terminal of the comparator 1166. The T5 signal is a DC voltage signal indicating the correction voltage.

The comparison 1166 outputs a high-level S1 signal when the level of the S3 signal is higher than that of the S5 signal while it outputs a low-level S1 signal in the rest of the time.

Figure 24:
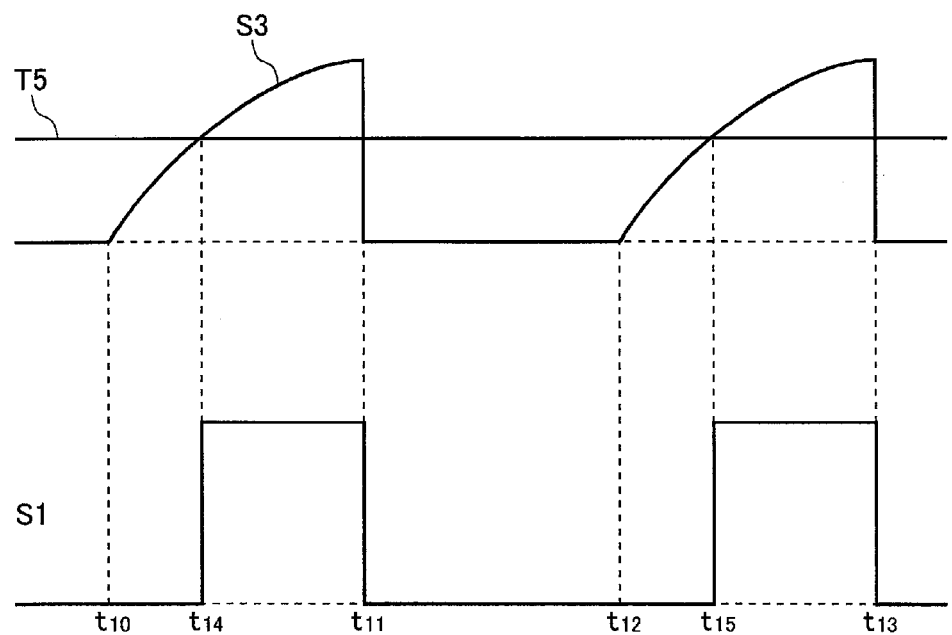
FIG. 24 is a time chart illustrating a relationship among S1, S3, and T5 signals.

FIG. 24 is a time chart illustrating a relationship among the S1, S3, and T5 signals. The S3 signal is an AC voltage signal of the drive frequency fo. The S3 signal indicates the current phase. The level of the S3 signal starts increasing at time t10 and abruptly decreases at time t11. The time period from time t10 to time t11 corresponds to the unit period of the S3 signal. Since the drive frequency fo is 90 to 99 kHz, the time length of the unit period is around 0.01 (msec).

The T5 signal is a DC voltage signal whose voltage level changes depending on the correction voltage. The comparator 1166 compares the S3 signal and T5 signal and generates a high-level S1 signal when the level of the S3 signal is higher than that of the T5 signal while it outputs a low-level S1 signal in the rest of the time. Among the unit period from t10 to t11, the S1 signal assumes a low level from time t10 to t14 and assumes a high level from time t14 to t11. The level of the T5 signal is changed by the correction voltage, causing the duty ratio of the S1 signal to change. Although the details will be described later, when the load voltage V5 increases, the correction potential decreases, and the level of the T5 signal increases. As a result, the duty ratio of the S1 signal decreases, and the rising time of the S1 signal occurs later than that of the S3 signal.

Figure 25:
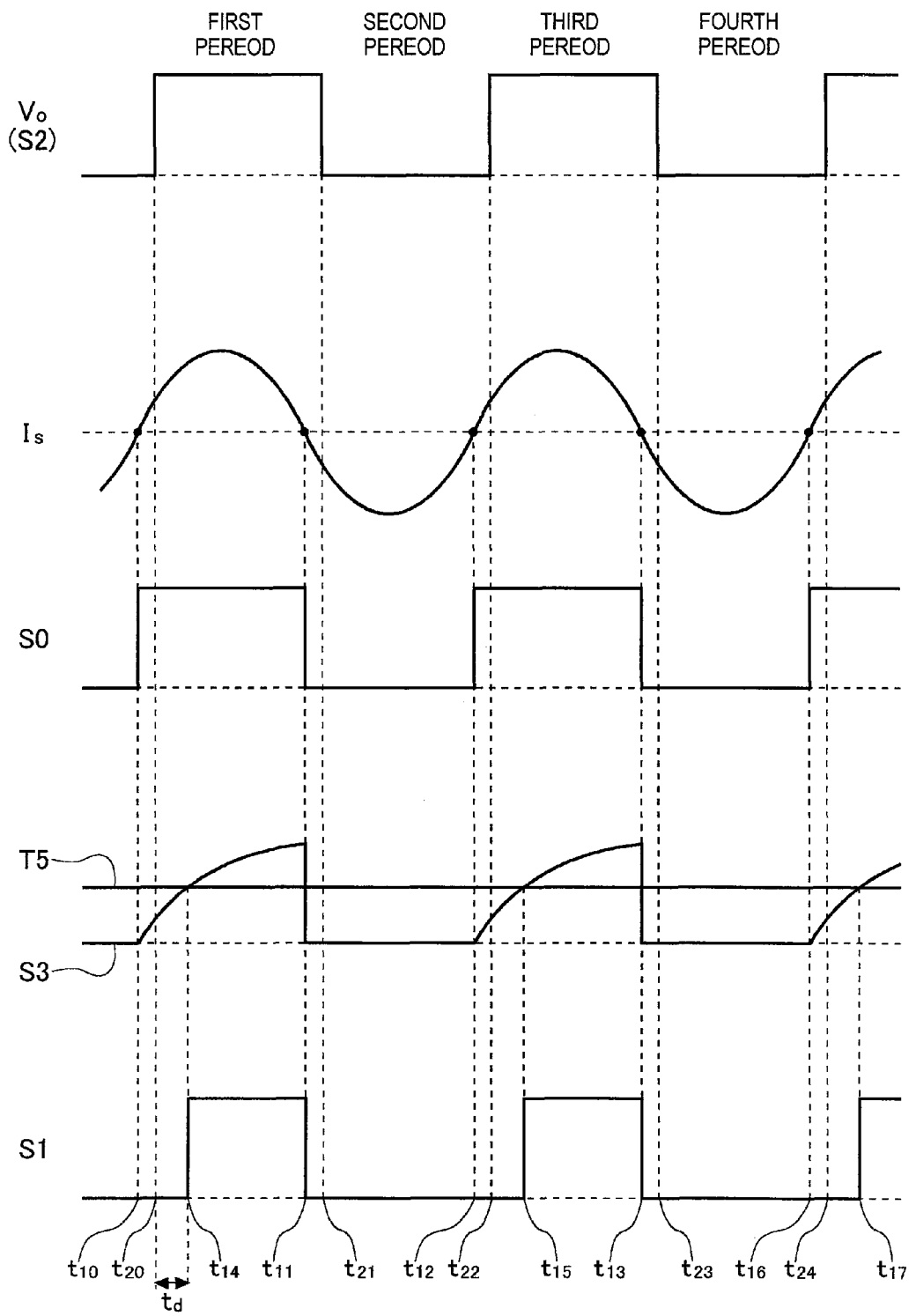
FIG. 25 is a time chart illustrating a relationship between S1 and S2 signals.

FIG. 25 is a time chart illustrating a relationship between the S1 signal and S2 signal. Time period from time t20 to time t21 (hereinafter, referred to as "first period") is a time period during which the switching transistor Q1 is ON while the switching transistor Q2 is OFF. Time period from time t21 to time t22 (hereinafter, referred to as "second period") is a time period during which the switching transistor Q1 is OFF while the switching transistor Q2 is ON. Time period from time t22 to time t23 (hereinafter, referred to as "third period") is a time period during which the switching transistor Q1 is ON while the switching transistor Q2 is OFF. Time period from time t23 to time t24 (hereinafter, referred to as "fourth period") is a time period during which the switching transistor Q1 is OFF while the switching transistor Q2 is ON.

At time t20, the AC voltage Vo (S2 signal) changes from the minimum value to the maximum value. At time t21 at which the first time period is ended, the AC voltage Vo (S2 signal) changes from the maximum value to the minimum value. Hereinafter, a timing (represented by, e.g., time t20) at which the S2 signal rises is referred to as "voltage phase value".

In the case where the drive frequency fo is lower than the resonance frequency fr, a capacitive reactance component appears in the impedance Z of the feeding coil circuit 1120 (LC resonance circuit), and the current phase of the current Is advances with respect to the voltage phase. Thus, the S0 signal indicating a current phase rises at time t10 which is earlier than time t20. Hereinafter, a timing (represented by, e.g., time t10 at which the S0 signal rises is referred to as "current phase value". In the example of FIG. 25, a value obtained by t20–t10 represents the phase difference. Here, t20–t10>0 is established, so that the current phase advances with respect to the voltage phase.

When the S0 signal rises at time t10, the level of the S3 signal starts increasing. At time t11 at which the level of the S0 signal becomes zero, the level of the S3 signal also abruptly decreases.

The T5 signal is a DC voltage signal whose level changes depending on the magnitude of the correction voltage. In FIG. 25, the correction voltage is detected, that is, the load voltage V5 deviates from a desired value.

The S3 signal and T5 signal are input to the positive terminal and negative terminals of the comparator 1166, respectively, and the S1 signal is output from the comparator 1166. During the level of S3 signal is higher than that of T5 signal, the level of the S1 signal is set high, while in the rest of time, the level of the S1 signal is set low. In FIG. 25, the level of the S3 signal is higher than that of the T5 (S3>T5) at time t14 (hereinafter, such a timing is referred to also as "corrected current phase value") which is later than time t10. The voltage level of the T5 signal serves as a "reference value" for determining the corrected current phase value.

The phase comparison circuit 1150 compares rising edge time t10 of the S2 signal and rising edge time t14 of the S1 signal to calculate the phase difference td. Although the actual phase difference is t20–t10 (>0), the phase difference recognized by the phase comparison circuit 1150 is obtained by t20–t14 (<0). The phase comparison circuit 1150 outputs the phase difference indicating voltage SC corresponding to a value obtained by t20–t14. The VCO 202 determines that the current phase delays with respect to the voltage phase, that is, the drive frequency fo is higher than the resonance frequency fr and tries to eliminate the phase difference by reducing the drive frequency fo. As a result, feedback control is executed such that the power transmission efficiency is degraded, the load voltage V5 is reduced, and the correction voltage is eliminated.

For example, the resistance value of the load LD increases, the load current I5 decreases while the load voltage V5 increases (refer to FIG. 15). When the load voltage V5 increases, the measurement potential increases while the correction voltage decreases. As a result, the voltage level of the T0 signal (DC voltage signal) decrease.

When the voltage level of the T0 signal decreases, the duty ratio of the T2 signal increases (refer to FIG. 20). As a result, the duty ratio of the T4 signal (output signal) also increases (refer to FIG. 22). When the duty ratio of the T4 signal increases, the voltage level of the T5 signal (DC voltage signal) increases. As a result, the duty ratio of the S1 signal decreases. Further, the rising edge of the S1 signal occurs later than that of the S2 signal, so that the phase comparison circuit 1150 recognizes that current phase delays with respect to the voltage phase. In order to eliminate the delay of the current phase, the phase comparison circuit 1150 issues the phase difference indicating voltage SC to the VCO 1202 for decreasing the drive frequency fo. Then, the deviation between the resonance frequency fr and drive frequency fo becomes larger to cause the power transmission efficiency to decrease (refer to FIGS. 17 and 18), with the result that the load voltage V5 decreases. With such feedback control, the load voltage V5 can be kept at a fixed value. The same feedback control is performed when the load voltage V5 decreases.

Figure 26:
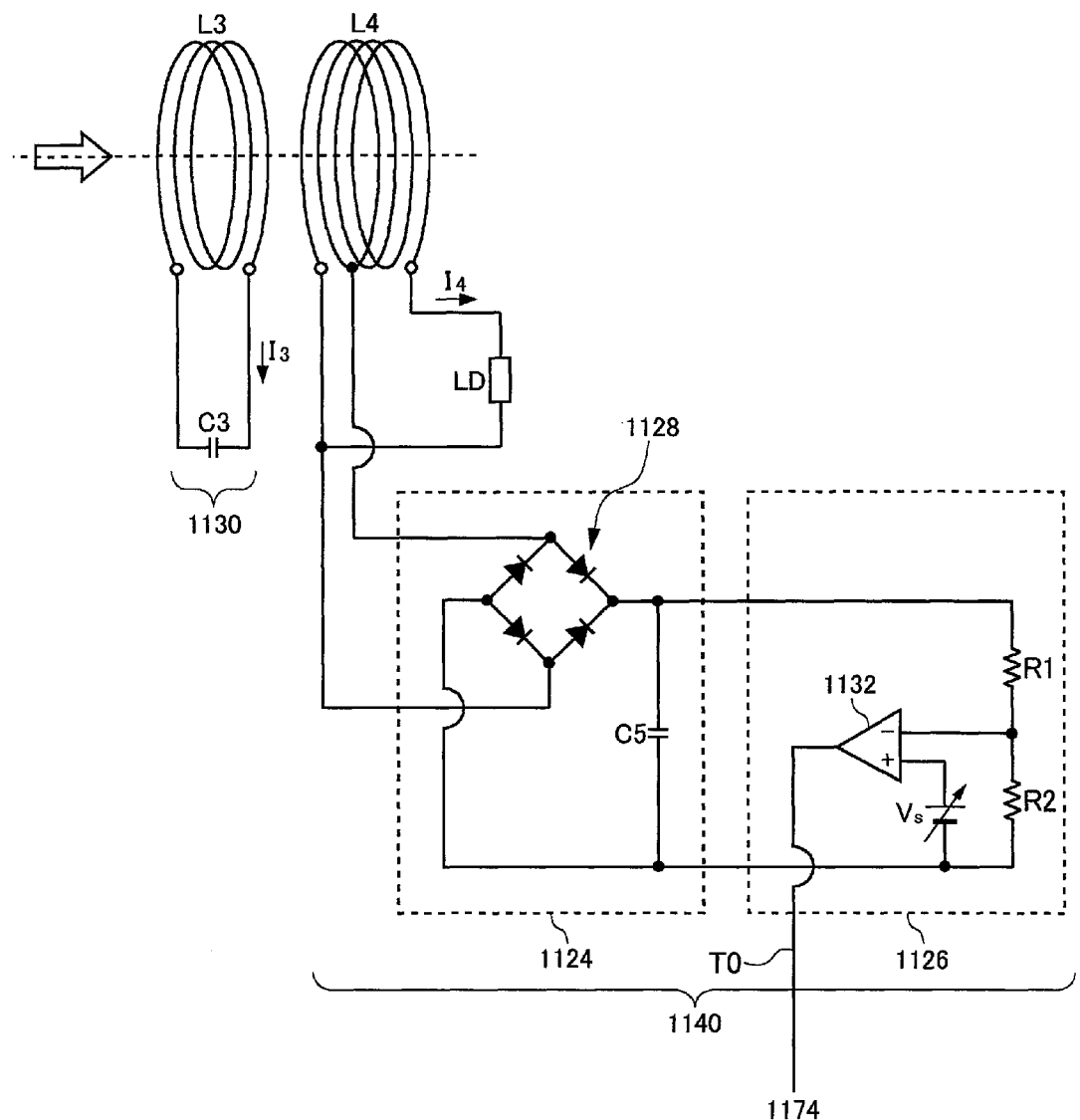
FIG. 26 is a circuit diagram illustrating a modification example of a wireless power receiver in the second embodiment.

FIG. 26 is a circuit diagram illustrating a modification example of the wireless power receiver 1118 in the second embodiment. Although the DC current I5 is fed to the load LD in FIG. 14, the AC current I4 may directly be fed to the load LD in the modification example. In this case, the rectification circuit 1124 and measurement circuit 1126 are connected to a part of the load coil L4 so as to allow the T0 signal to be output.

Figure 27:
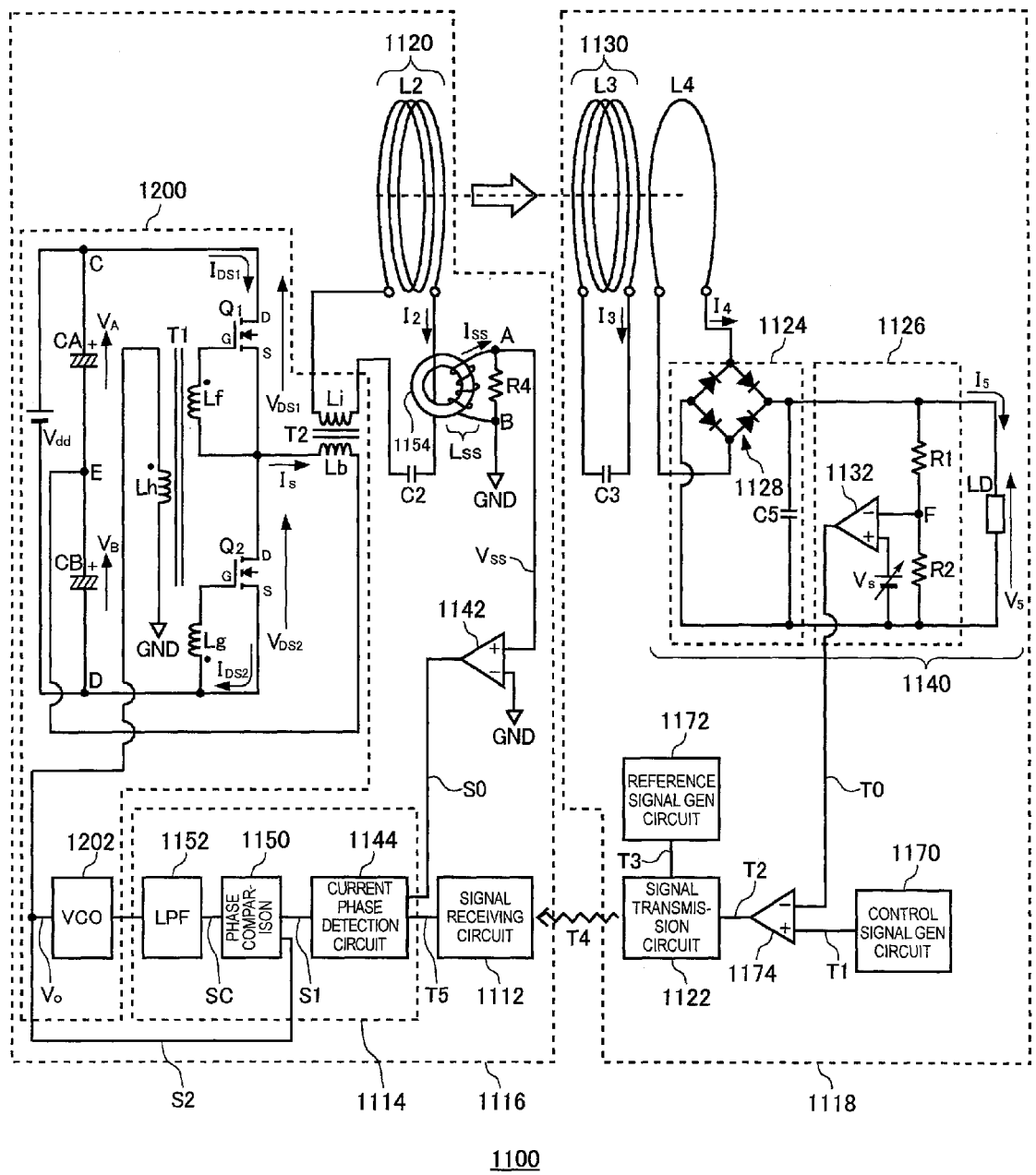
FIG. 27 is a system configuration view illustrating a modification example of the wireless power transmission system in the second embodiment.

FIG. 27 is a system configuration view of a wireless power transmission system 1100 which is a modification of the second embodiment. In the wireless power transmission system 1100 of the modification, the power transmission control circuit 1200 directly drives the feeding coil circuit 1120 without intervention of the exciting circuit 1110. Components designated by the same reference numerals as those of FIG. 14 have the same or corresponding functions as those in FIG. 14.

The feeding coil circuit 1120 in the modification is a circuit in which the transformer T2 secondary coil Li is connected in series to the feeding coil L2 and capacitor C2. The transformer T2 secondary coil Li constitutes a coupling transformer T2 together with the transformer T2 primary coil Lb and receives AC power from the power transmission control circuit 1200 by electromagnetic induction. Thus, the AC power may be directly fed from the power transmission control circuit 1200 to the feeding coil circuit 1120 without intervention of the exciting circuit 1110.

The wireless power transmission system has been described above based on the embodiments. In the wireless power feeding of a magnetic field resonance type, the power transmission efficiency can be controlled by the difference between the resonance frequency fr and drive frequency fo. The drive frequency fo can be made to automatically track a change of the resonance frequency fr, making it easy to kept the power transmission efficiency constant even if use conditions are changed. Further, even when the load LD or intercoil distance d is changed, the load voltage V5 can be kept constant by the feedback control based on the correction voltage. A change of the level of the S1 signal based on the correction voltage allows ex-post adjustment of the power transmission efficiency. According to the experiment made by the present inventor, significant power loss was not found to occur in association with the level adjustment of the S1 signal.

The T0 signal which is a DC voltage signal is converted into the T4 signal which is an AC light signal, and the T4 signal is emitted from the wireless power receiver to the wireless power feeder. The T4 signal as the light signal is hardly subject to the magnetic field generated by the feeding coil L2 and the like, an advantage that signals can favorably be transmitted can be obtained.

Further, the reference potential may manually be adjusted on the power receiving side. This allows the correction voltage to be detected not only when the measurement potential is changed but also the reference voltage is changed, with the result that the power transmission efficiency can be adjusted. For example, when the reference potential is made to decrease, such feedback control as to decrease the measurement potential is made, casing the load voltage V5 to decrease. That is, feeding power can be controlled on the power receiving side.

As an application example, the following configuration may be possible. That is, the wireless power feeder and a table are integrated with each other, and the wireless receiver is incorporated in a table lump placed on the table. In the case of a conventional table lamp, a power cord gets in the way, so that a pendant lamp is often used for a dining table. According to the above application example, it is possible to eliminate the need of providing a power cord of the table lamp, thereby increasing availability of the table lamp. For example, there may be a case where food looks more attractive under illumination of the table lamp. Further, the illumination location is fixed in the case of the pendant lamp, while the table lamp can freely be laid out, enabling various forms of illumination. In addition, in the case where a plurality of table lamps are placed on the table, adjusting the reference potential of only one table lump can collectively control the brightness of other lumps.

The above embodiments are merely illustrative of the present invention and it will be appreciated by those skilled in the art that various modifications may be made to the components of the present invention and a combination of processing processes and that the modifications are included in the present invention.

Although the power transmission control circuit 1200 is formed as a half-bridge type circuit in the above embodiment, the power transmission control circuit 1200 may be formed as a push-pull type circuit. The S3 signal generated by the current waveform shaping circuit 1168 or T1 signal generated by the control signal generation circuit 1170 may be an AC signal having not only a saw-tooth waveform but also a triangle wave or a sine wave in which a voltage value is gradually increased or decreased within a predetermined time period. Although the current phase is set as an adjustment target in the present embodiment, the voltage phase may be adjusted based on the T0 signal. Further, the feedback control may be effected based not only on the output voltage but on the current or power.

The T4 signal is not limited to a light signal such as an infrared ray but may be a radio signal. At any rate, it is only necessary for the T4 signal to have a frequency band sufficiently away from the frequency band of the drive frequency fo or resonance frequency fr. The infrared ray LED 1158 and photodiode 1160 are comparatively low in price, so that the light signal is adopted in the present embodiments.

What is claimed is:

1. A wireless power feeder for feeding power from a feeding coil to a receiving coil, comprising:
   a power transmission control circuit that feeds AC power to the feeding coil at a drive frequency;
   a feeding coil circuit that includes the feeding coil and a capacitor and resonates at a resonance frequency of the receiving coil;
   a phase detection circuit that detects a phase difference between the voltage phase and current phase of the AC power; and
   a signal receiving circuit that receives an output signal indicating the magnitude of an output from a power receiving side of the AC power, wherein the power transmission control circuit adjusts the drive frequency so as to reduce the phase difference to make the drive frequency track the resonance frequency, and the phase detection circuit performs ex-post adjustment of the detected value of one or both of the voltage and current phases according to the output signal.

2. The wireless power feeder according to claim 1, wherein the phase detection circuit converts one or both of voltage and current components of the AC power into a signal having a saw-tooth waveform for detection of the phase difference.

3. The wireless power feeder according to claim 1, wherein the signal receiving circuit receives the output signal as a light signal.

4. The wireless power feeder according to claim 1, wherein the phase detection circuit compares a first phase value indicating a timing at which the voltage level of the AC power becomes a first reference value and a second phase value indicating a timing at which the current level of the AC power becomes a second reference value to detect the phase difference and changes one or both of the first and second reference values based on the output signal to perform ex-post adjustment of one or both of the first and second phase values.

5. The wireless power feeder according to claim 1, wherein the output signal is an AC signal indicating the magnitude of the output by the magnitude of signal frequency.

6. The wireless power feeder according to claim 1, further comprising an exciting coil that is magnetically coupled to the feeding coil and feeds AC power fed from the power transmission control circuit to the feeding coil, wherein the power transmission control circuit includes first and second current paths and makes first and second switches connected in series respectively to the first and second current paths alternately conductive at the drive frequency to feed the AC power to the exciting coil.

7. The wireless power feeder according to claim 1, further comprising a detection coil that generates inductive current using a magnetic field generated by the AC power, wherein the phase detection circuit measures the phase of the inductive current flowing in the detection coil to achieve measurement of the current phase of the AC power.

8. A wireless power receiver that receives AC power fed from the wireless power feeder as claimed in claim 1 at a receiving coil, the receiver comprising:
   a receiving coil circuit that includes the receiving coil and a capacitor and resonates at the resonance frequency of the feeding coil;
   a loading circuit that includes a loading coil that is magnetically coupled to the receiving coil to receive the AC power from the receiving coil and a load that receives power from the loading coil; and
   a signal transmission circuit that transmits, to the wireless power feeder, an output signal indicating the magnitude of output voltage to be applied to a part of the loading circuit.

9. The wireless power receiver according to claim 8, wherein the signal transmission circuit transmits the output signal as a signal indicating a difference value between the output voltage and a reference voltage.

10. The wireless power receiver according to claim 9, wherein the value of the reference voltage is adjustable.

11. The wireless power receiver according to claim 8, wherein the output signal is an AC signal indicating the magnitude of the output voltage by the magnitude of signal frequency.

12. The wireless power receiver according to claim 8, wherein the loading circuit includes a rectification circuit, and the output voltage is generated by the rectification circuit as a DC current.

13. A wireless power transmission system for feeding power from a feeding coil to a receiving coil, comprising:
   a power transmission control circuit that feeds AC power to the feeding coil at a drive frequency;
   a feeding coil circuit that includes the feeding coil and a first capacitor;
   a receiving coil circuit that includes the receiving coil and a second capacitor;
   a loading circuit that includes a loading coil that is magnetically coupled to the receiving coil to receive the AC power from the receiving coil and a load that receives power from the loading coil; and
   a phase detection circuit that detects a phase difference between the voltage phase and current phase of the AC power, wherein the power transmission control circuit adjusts the drive frequency so as to reduce the phase difference, and the phase detection circuit performs ex-post adjustment of the detected value of one or both of the voltage and current phases according to the magnitude of an output voltage to be applied to a part of the loading circuit.

* * * * *